US011328371B2

(12) United States Patent
Hiroe et al.

(10) Patent No.: US 11,328,371 B2
(45) Date of Patent: May 10, 2022

(54) ADJUSTING POWER MEASURING APPARATUS, ADJUSTING POWER MEASURING SYSTEM, AND MEASURING INSTRUMENT

(71) Applicant: MITSUBISHI HEAVY INDUSTRIES, LTD., Tokyo (JP)

(72) Inventors: Takaharu Hiroe, Tokyo (JP); Kazunari Ide, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 721 days.

(21) Appl. No.: 16/356,898

(22) Filed: Mar. 18, 2019

(65) Prior Publication Data

US 2019/0295191 A1  Sep. 26, 2019

(30) Foreign Application Priority Data

Mar. 22, 2018 (JP) .............................. JP2018-055184
Jan. 16, 2019 (JP) .............................. JP2019-005480

(51) Int. Cl.
| | | |
|---|---|---|
| G06Q 50/06 | (2012.01) | |
| H02J 13/00 | (2006.01) | |
| G06Q 30/02 | (2012.01) | |
| G01R 22/10 | (2006.01) | |
| G01R 22/06 | (2006.01) | |
| H02J 3/12 | (2006.01) | |

(52) U.S. Cl.
CPC ........... *G06Q 50/06* (2013.01); *G01R 22/068* (2013.01); *G01R 22/10* (2013.01); *G06Q 30/0283* (2013.01); *H02J 3/12* (2013.01); *H02J 13/0006* (2013.01)

(58) Field of Classification Search
CPC ...................................................... G06Q 50/06
See application file for complete search history.

(56) References Cited

U.S. PATENT DOCUMENTS

2015/0254585 A1* 9/2015 Noda ...................... H02J 3/004
705/7.28

FOREIGN PATENT DOCUMENTS

| DE | 1247452 B | 8/1967 |
|---|---|---|
| JP | 5886400 B1 | 3/2016 |

* cited by examiner

*Primary Examiner* — Joseph Chang
(74) *Attorney, Agent, or Firm* — Osha Bergman Watanabe & Burton LLP

(57) ABSTRACT

An adjusting power measuring apparatus includes: a processor that: acquires an active power measurement value of active power exchanged at a connection point between a targeted power grid and an adjusting power supply source that supplies adjusting power to the targeted power grid, acquires a frequency measurement value of frequency at the connection point, calculates, based on the active power measurement value and the frequency measurement value, a first adjusting power coefficient indicating a degree of influence that fluctuation in the active power has on fluctuation in the frequency, calculates, based on the first adjusting power coefficient and a fluctuation measurement value of the fluctuation in the frequency, the adjusting power supplied from the adjusting power supply source to the targeted power grid, and determines, based on the calculated adjusting power, compensation to be paid to an owner of the adjusting power supply source.

12 Claims, 13 Drawing Sheets

D1

<WEIGHT COEFFICIENT TABLE>

| DELAY TIME tD (SEC) | 0 | 1 | 2 | 3 | 4 | ... | 3600 |
|---|---|---|---|---|---|---|---|
| WEIGHT COEFFICIENT w | 1.0 | 0.9 | 0.8 | 0.7 | 0.6 | ... | 0 |

<WEIGHT COEFFICIENT TABLE>

| DELAY TIME tD (SEC) | -10 | -9 | ... | -1 | 0 | 1 | 2 | ... | 3600 |
|---|---|---|---|---|---|---|---|---|---|
| WEIGHT COEFFICIENT w | 0 | 0.9 | ... | 0.9 | 1.0 | 0.9 | 0.8 | ... | 0 |

# ADJUSTING POWER MEASURING APPARATUS, ADJUSTING POWER MEASURING SYSTEM, AND MEASURING INSTRUMENT

CROSS-REFERENCE TO RELATED APPLICATION

The present application claims priority to Japanese Patent Application No. 2018-055184 filed on Mar. 22, 2018 and Japanese Patent Application No. 2019-005480 filed on Jan. 16, 2019, the contents of which are incorporated herein by reference.

BACKGROUND

Technical Field

The present invention relates to an adjusting power measuring apparatus, adjusting power measuring system, and measuring instrument.

Description of the Related Art

Frequencies of power transmission and distribution systems are maintained by combining "adjusting power" (defined below) from power sources based on (1) Governor Free (GF) operation, (2) Load Frequency Control (LFC), and (3) Economic load Dispatching Control (EDC), depending on fluctuation cycles of power demand. Due to electricity liberalization and deregulation, it is generally assumed that adjusting power is supplied from power generation companies to power transmission and distribution companies through public offering or on the market.

Power demand in offices, factories, and general households may fluctuate at any given moment. When the power demand exceeds the power supply, the frequency of the power transmission and distribution system drops below a reference value (e.g., 50 Hz or 60 Hz). Conversely, when the power supply exceeds the power demand, the frequency rises above the reference value. "Adjusting power" balances such fluctuations in supply and demand. When adjusting power is ideally supplied, the frequency coincides with the reference value.

Load frequency control (LFC) is generally used for fluctuations of more than a few minutes but less than 30 minutes. LFC can supply adjusting power depending on frequency fluctuation in the power transmission and distribution system. Thus, when the frequency of the power transmission and distribution system does not reach the reference value, the general power transmission and distribution company that controls the system receives positive adjusting power from power generation companies. On the other hand, when the frequency of the power transmission and distribution system reaches or exceeds the reference value, the general power transmission and distribution company receives negative adjusting power from the power generation companies. With LFC, the power generation company supplies adjusting power by adjusting an output of the power source in response to instructions received from the general power transmission and distribution company.

To provide stable power supply with LFC, power generation companies must supply adjusting power exactly according to the instructions from the general power transmission and distribution company. For this reason, with the electricity liberalization and deregulation, a scheme has been considered where the power transmission and distribution company pays for the actually-supplied adjusting power (settlement of supply of the adjusting power) to the power generation company.

However, where the general power transmission and distribution company instructs the power generation company to supply adjusting power sharply fluctuating within a very short time period (e.g., a few seconds), the power generation company may not be able to respond to the instruction in time. In such a case, the power generation company may get a penalty. Moreover, the frequency differs for each location in the power transmission and distribution system. Although it is desirable to provide detailed instructions for each location in the power transmission and distribution system, doing so is impractical for fluctuations that occur within a short time period (e.g., 3 to 5 seconds).

For this reason, with respect to short-period demand fluctuation, adjustments are generally made through governor-free (GF) operations autonomously performed by power sources (comprising turbine devices and generators) owned by the power generation companies. GF refers to an operation of controlling an amount of fuel supplied to the turbine device to maintain a generator's rotation speed despite fluctuations in the rotation speed due to load variation.

A power source that uses a turbine device as the driving force stores inertial energy during operation. This inertial energy is automatically transferred to and from the load according to load fluctuation, thereby contributing to stable operation as cushioning (buffer) for the load fluctuation.

Japanese Patent No. 5886400 discloses a system and method for price formation in a power market.

GF operation (and/or supply of adjusting power by inertia) is autonomously executed by each of the power sources regardless of the instructions from the power transmission and distribution system, and is not measured by the power transmission and distribution system. Thus, whereas the adjusting power supplied via LFC requires payment of compensation (settlement), the adjusting power supplied via GF operation or inertia does not. Therefore, there is a need for measuring the adjusting power actually supplied by an adjusting power supply source and including the adjustment power provided via GF operation.

SUMMARY

One or more embodiments of the present invention provide an adjusting power measuring apparatus, adjusting power measuring system, adjusting power measuring method, recording medium, and measuring instrument that can measure adjusting power actually supplied by an adjusting power supply source.

An adjusting power measuring apparatus of one or more embodiments comprises: a processor that: acquires an active power measurement value of active power exchanged at a connection point between a targeted power grid and an adjusting power supply source that supplies adjusting power to the targeted power grid, acquires a frequency measurement value of frequency at the connection point, calculates, based on the active power measurement value and the frequency measurement value, a first adjusting power coefficient indicating a degree of influence that fluctuation in the active power has on fluctuation in the frequency, calculates, based on the first adjusting power coefficient and a fluctuation measurement value of the fluctuation in the frequency, the adjusting power supplied from the adjusting power supply source to the targeted power grid, and determines, based on the calculated adjusting power, compensation to be paid to an owner of the adjusting power supply source.

An adjusting power measuring apparatus of one or more embodiments comprises: a processor that: acquires an active power measurement value of active power exchanged at a connection point between a targeted power grid and an adjusting power supply source that supplies adjusting power to the targeted power grid, acquires a frequency measurement value of frequency at the connection point, calculates the adjusting power supplied from the adjusting power supply source to the targeted power grid based on a fluctuation amount of the active power measurement value and a sum of values respectively obtained by multiplying a predetermined weight coefficient with each fluctuation amount between two frequency measurement values acquired serially in time within a predetermined time period, and determines, based on the calculated adjusting power, compensation to be paid to an owner of the adjusting power supply source.

An adjusting power measuring system of one or more embodiments comprises: the aforementioned adjusting power measuring apparatus; and a measurement instrument installed at the connection point between the targeted power grid and the adjusting power supply source and capable of measuring the active power exchanged at the connection point and the frequency at the connection point, and the processor of the adjusting power measuring apparatus acquires the active power measurement value and the frequency measurement value via the measurement instrument.

A measurement instrument of one or more embodiments is installed at a connection point between a targeted power grid and an adjusting power supply source that supplies adjusting power to the targeted power grid, the measurement instrument comprises: a sensor that measures active power exchanged at the connection point and frequency at the connection point, a processor that: acquires an active power measurement value and a frequency measurement value via the sensor; calculates, based on the active power measurement value and the frequency measurement value, a first adjusting power coefficient indicating a degree of influence that fluctuation in the active power has on fluctuation in the frequency, calculates, based on the first adjusting power coefficient and a fluctuation measurement value of the fluctuation in the frequency, the adjusting power supplied from the adjusting power supply source to the targeted power grid, and determines, based on the calculated adjusting power, compensation to be paid to an owner of the adjusting power supply source.

DETAILED DESCRIPTION OF EMBODIMENTS

Embodiments of the present invention will now be described herein with reference to the drawings by way of example. Those skilled in the art will recognize that many alternative embodiments can be accomplished using the teaching of the present invention and that the present invention is not limited to the embodiments illustrated herein for explanatory purposes.

First, an adjusting power measuring apparatus of one or more embodiments and an adjusting power measuring system comprising the apparatus will be described with reference to FIGS. 1-8.

(Overall Structure of Adjusting Power Measuring System)

Figure 1:
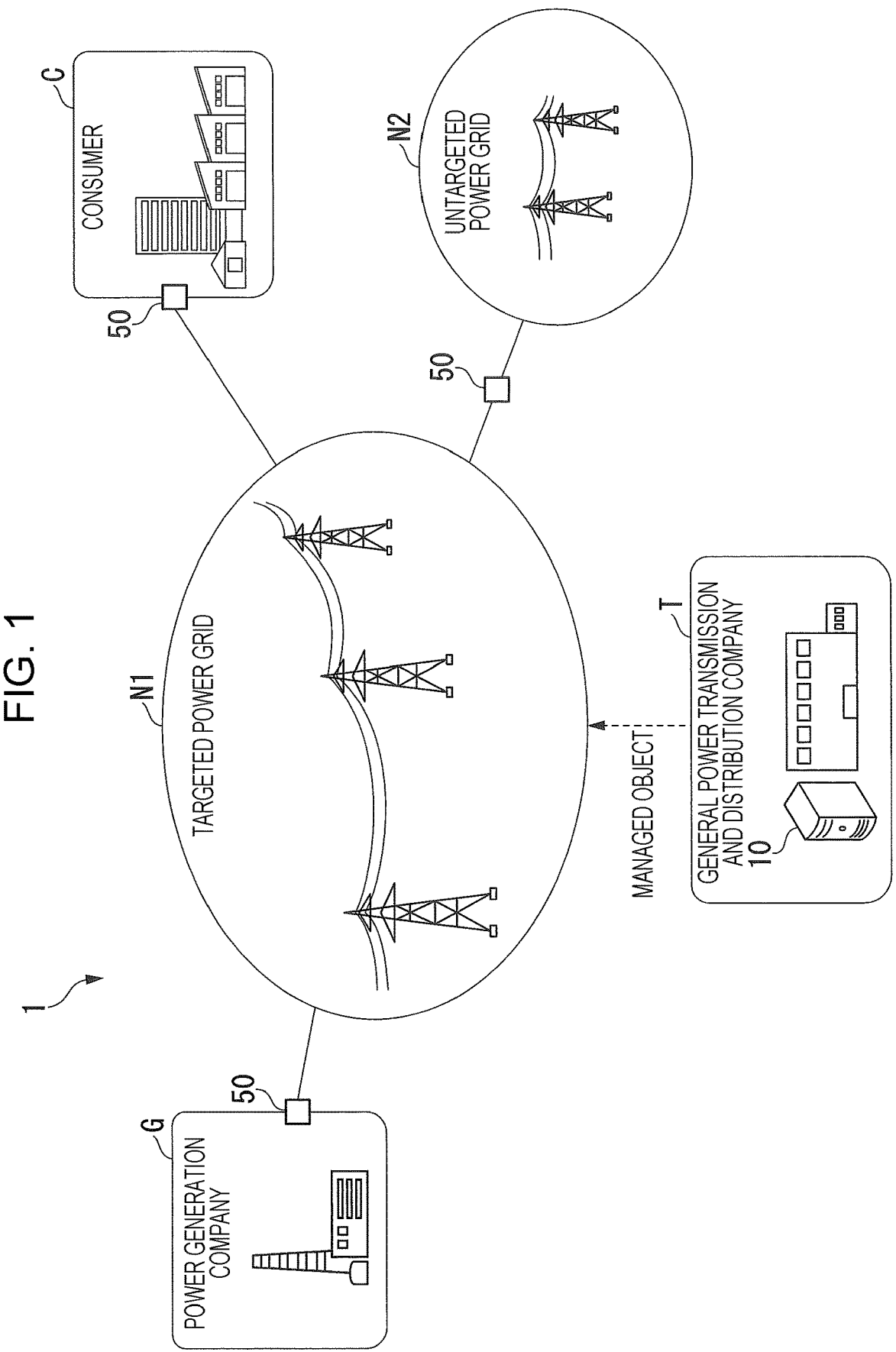
FIG. 1 is a diagram illustrating an overall structure of an adjusting power measuring system according to one or more embodiments.

FIG. 1 is a diagram illustrating the overall structure of the adjusting power measuring system according to one or more embodiments.

FIG. 1 shows: a power generation company G which performs power generation; a general power transmission and distribution company ("transmission and distribution company") T which performs transmission and distribution of the generated power; and a consumer C who consumes the transmitted and distributed power. In one or more embodiments, the power generation company G and the consumer C are connected to a power grid ("targeted power grid N1") managed by the transmission and distribution company T. The power generated by the power generation company G is delivered to the consumer C via the targeted power grid N1. The targeted power grid N1 is also connected to a power grid ("untargeted power grid N2") managed by another general power transmission and distribution company ("another transmission and distribution company").

As illustrated in FIG. 1, an adjusting power measuring system 1 of one or more embodiments comprises an adjusting power measuring apparatus 10 and measuring instruments 50.

The adjusting power measuring apparatus 10 is managed (operated) by the transmission and distribution company T. The adjusting power measuring apparatus 10 is capable of measuring an "adjusting power" actually supplied by the power generation company G to keep or stabilize a demand and supply balance of power in the targeted power grid N1. The specific functional composition of and the processing executed by the adjusting power measuring apparatus 10 will be described later.

The measuring instrument 50 is installed at a connection point between the targeted power grid N1 and each of adjusting power supply sources managed by the power generation company G or the like, and capable of measuring active power exchanged at the connection point and a frequency at the connection point. The "adjusting power supply sources" refer to devices/systems capable of supplying the adjusting power that adjusts the demand and supply balance to the power grid (targeted power grid N1). Specifically, the adjusting power supply sources comprise: a power source managed by the power generation company G; a stabilization device; a load managed by the consumer C; and a power grid (untargeted power grid N2) which is not managed by the transmission and distribution company T.

The measuring instrument 50 of one or more embodiments may be a general power meter with a frequency measurement function.

(Structural Details of Adjusting Power Measuring System)

Figure 2:
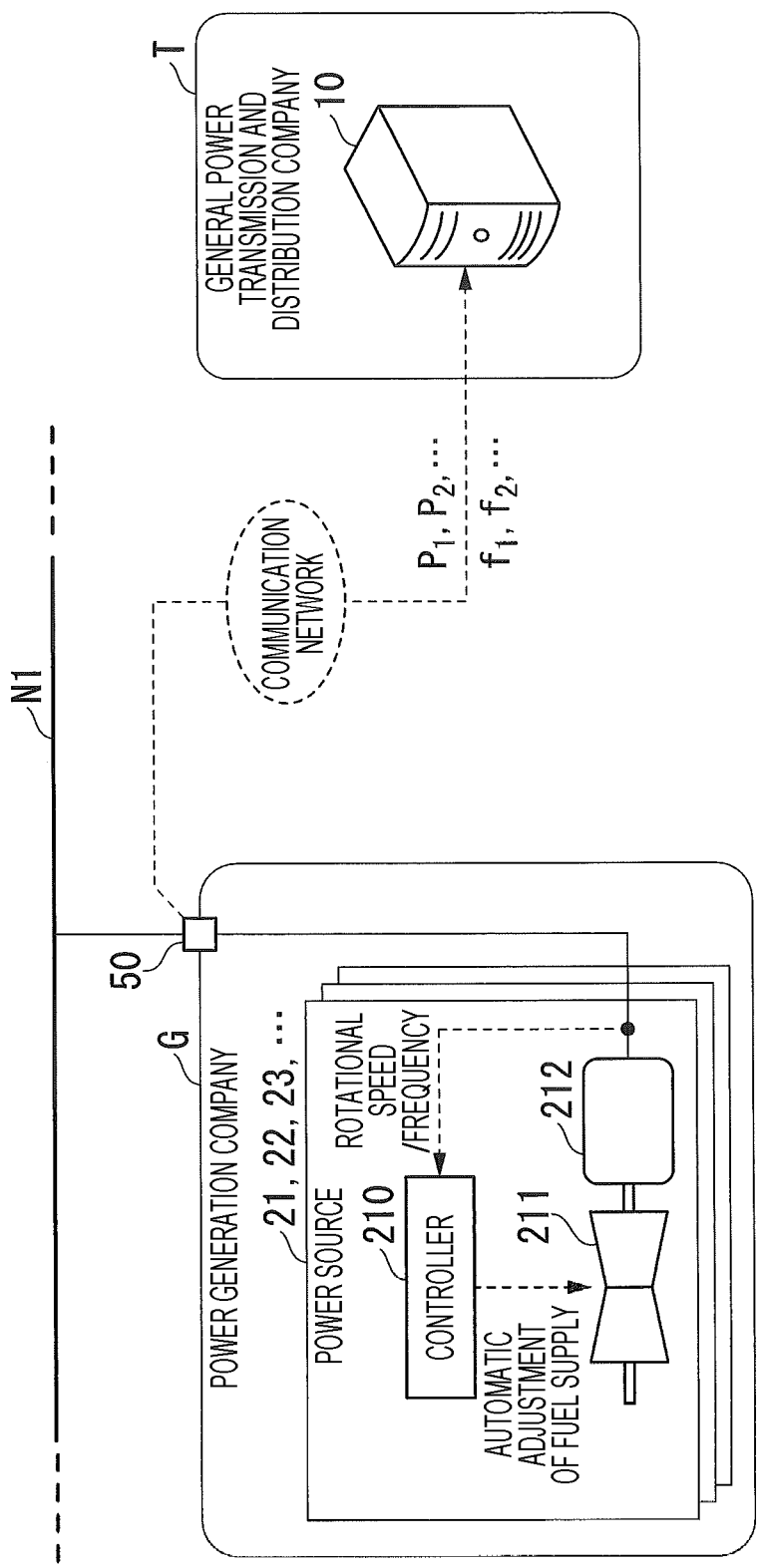
FIG. 2 is a first diagram illustrating in detail the structure of the adjusting power measuring system according to one or more embodiments.

FIG. 2 is a first diagram illustrating in detail the structure of the adjusting power measuring system according to one or more embodiments.

As illustrated in FIG. 2, the power generation company G manages a plurality of power sources 21, 22, 23, etc.

Hereinafter a power source 21 will be explained as an example of the power sources 21, 22, 23, etc. managed by the power generation company G. Other power sources 22, 23, etc. have the same structures and functions as those of the power source 21.

The power source 21 comprises a controller 210, turbine device 211 (e.g., a gas turbine and a steam turbine), and generator 212.

The controller 210 controls operations of the turbine device 211 and the generator 212. For example, the controller 210 continuously monitors a rotation speed (corresponding to a frequency of output) of the generator 212, and automatically adjusts an amount of fuel or steam supplied to the turbine device 211 to keep the rotation speed constant. This automatic adjustment is called governor-free (GF) operation. According to this operation, when the load (power demand) increases within a short period and the rotation speed of the generator 212 decreases, the controller 210 increases the amount of fuel supplied to the turbine device 211 to return the rotation speed to its original state. The increment of output needed for the generator 212 to have its original rotation speed corresponds to the "adjusting power" that the power source 21 supplied to the increase of the load (power demand). To the variation of the power demand within a short period (period of about 3-5 seconds), the adjusting power is successively supplied by GF operation by the power source 21.

In GF operation executed by the controller 210, the output (adjusting power $\Delta P$) that the power source 21 generates correspondingly to a variation amount (frequency shift $\Delta f$) of the rotation speed of the generator 212 is defined as Formula (1) below using a permanent speed variation (droop) $\delta$.

[Formula 1]

$$\Delta P = \frac{1}{\delta} P_n \frac{\Delta f}{f_n} \quad (1)$$

In Formula (1), "$\Delta f$" indicates a frequency shift $\Delta f$ [Hz], which is a deviation of output frequency of the power source 21 with respect to a reference value (e.g., 50 Hz), "fn" indicates a reference value (e.g., 50 Hz) of the targeted power grid N1, and "Pn" indicates a rated output [W] of the power source 21. This relational formula is ideal and indicates a static balance state of the frequency and the output, but errors occur due to time delay of the output of the power source 21. The time delay may be caused by the inertia of the turbine device 211 and/or the control delay of the controller 210.

The power source 21 is connected to the targeted power grid N1. The measuring instrument 50 is installed at the connection point between the power source 21 and the targeted power grid N1.

The measuring instrument 50 installed at the connection point between the power source 21 and the targeted power grid N1 obtains an active power measurement value $P_1$ of the active power output from the power source 21 to the targeted power grid N1, and a frequency measurement value $f_1$. The measuring instrument 50 transmits the active power measurement value $P_1$ and the frequency measurement value $f_1$ to the adjusting power measuring apparatus 10 managed by the transmission and distribution company T thorough a predetermined communication network (e.g., internet connection).

Similarly, the measuring instruments 50 installed at connection points between other power sources 22, 23, etc. and the targeted power grid N1 obtain active power measurement values $P_2$, $P_3$, etc. output from the power sources 22, 23, etc. to the targeted power grid N1. The measuring instruments 50 also obtain frequency measurement values $f_2$, $f_3$, etc. Then, the measuring instruments 50 transmits the obtained active power measurement values and frequency measurement values to the adjusting power measuring apparatus 10.

(Hardware Configuration of Adjusting Power Measuring Apparatus)

Figure 3:
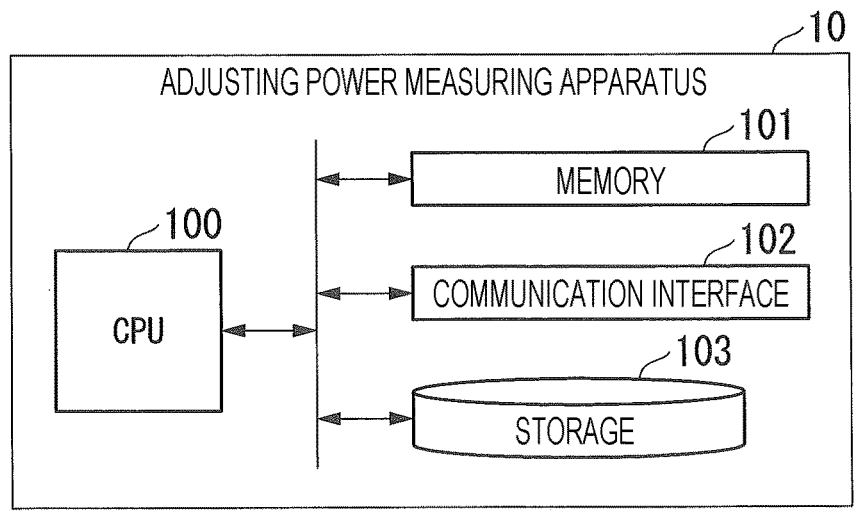
FIG. 3 is a block diagram illustrating a hardware configuration of an adjusting power measuring apparatus according to one or more embodiments.

FIG. 3 is a block diagram illustrating a hardware configuration of an adjusting power measuring apparatus according to one or more embodiments.

As illustrated in FIG. 3, the adjusting power measuring apparatus 10 comprises a processor (CPU) 100, memory 101, communication interface 102, and storage 103.

The memory 101 is a main memory, in which instructions and data for the CPU 100 to operate according to programs are expanded.

The communication interface 102 is an interface device for exchanging information with an external device/apparatus (especially the measuring instrument 50). In one or more embodiments, communication means and methods realized by the communication interface are not particularly limited. For example, the communication interface 102 of one or more embodiments is a wired connection interface for realizing wired communication, or a wireless communication module for realizing wireless communication.

The storage 103 is an auxiliary storage device. The storage 103 of one or more embodiments is a Hard Disk Drive (HDD), Solid State Drive (SSD), or the like.

(Functional Composition of Adjusting Power Measuring Apparatus)

Figure 4:
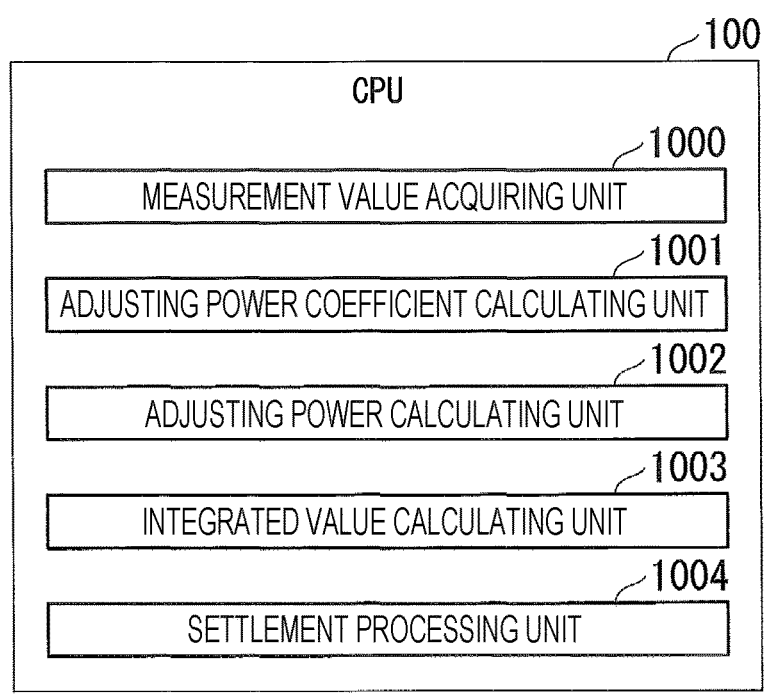
FIG. 4 is a block diagram illustrating a functional composition of the adjusting power measuring apparatus according to one or more embodiments.

FIG. 4 is a block diagram illustrating a functional composition of the adjusting power measuring apparatus according to one or more embodiments.

As illustrated in FIG. 4, the CPU 100 of the adjusting power measuring apparatus 10 operates according to the programs and functions as a measurement value acquiring unit 1000, adjusting power coefficient calculating unit 1001, adjusting power calculating unit 1002, integrated value calculating unit 1003, and settlement processing unit 1004.

The measurement value acquiring unit 1000 acquires the active power measurement values $P_1$, $P_2$, etc. and the frequency measurement values $f_1$, $f_2$, etc. shown in FIG. 2 via the measuring instruments 50 installed at the connection points.

The adjusting power coefficient calculating unit 1001 calculates first adjusting power coefficients $k_{p1}$, $k_{p2}$, etc. based on the active power measurement values $P_1$, $P_2$, etc. and the frequency measurement values $f_1$, $f_2$, etc. acquired by the measurement value acquiring unit 1000. The first adjusting power coefficients $k_{p1}$, $k_{p2}$, etc. are values indicating a degree of influence (contribution) that fluctuation in the active power (exchanged at the connection points between the power sources 21, 22, etc. and the targeted power grid N1) has on fluctuation in the frequency.

The adjusting power calculating unit 1002 calculates adjusting powers $\Delta P_{GF1}$, $\Delta P_{GF2}$, etc. supplied from the power sources 21, 22, etc. to the targeted power grid N1 based on the first adjusting power coefficients $k_{p1}$, $k_{p2}$, etc. calculated by the adjusting power coefficient calculating unit 1001 and frequency fluctuation measurement values $\Delta f_1$, $\Delta f_2$, etc.

The integrated value calculating unit 1003 calculates adjusting power integrated values $S_1$, $S_2$, etc. by integrating each of the adjusting powers $\Delta P_{GF1}$, $\Delta P_{GF2}$, etc. successively calculated by the adjusting power calculating unit 1002 over a predetermined unit period (e.g., 24 hours).

The settlement processing unit 1004 calculates compensation for the adjusting power integrated values $S_1$, $S_2$, etc. supplied by the power sources 21, 22, etc. by multiplying the calculated adjusting power integrated values $S_1$, $S_2$, etc. by predefined contract unit prices $\gamma_1$, $\gamma_2$, etc., respectively.

The adjusting power calculating unit 1002 is an example of an adjusting power measuring unit.

(Processing by Adjusting Power Measuring Apparatus)

Figure 5:
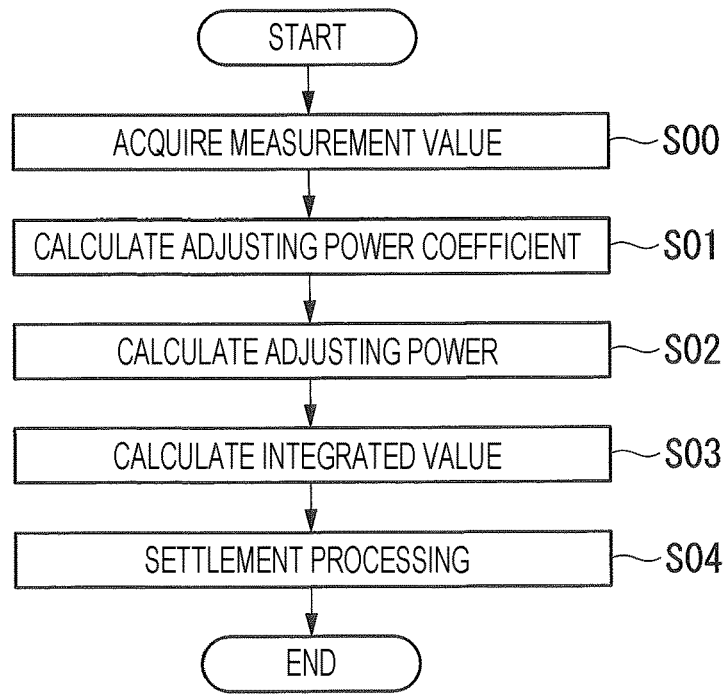
FIG. 5 is a flowchart illustrating processing by the adjusting power measuring apparatus according to one or more embodiments.

FIG. 5 is a flowchart illustrating processing by the adjusting power measuring apparatus according to one or more embodiments.

Figure 6:
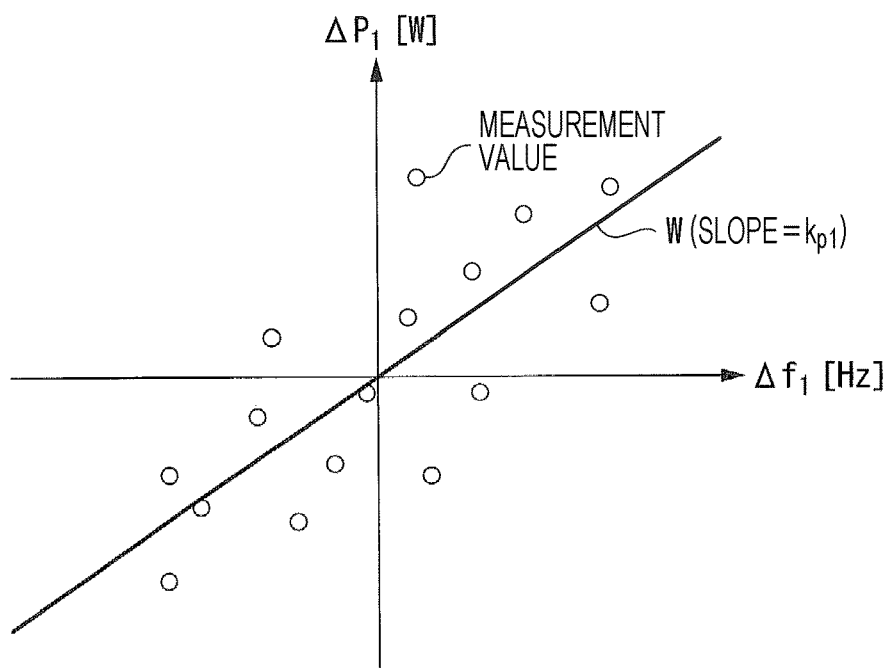
FIG. 6 is a diagram for explaining a function of the adjusting power measuring apparatus according to one or more embodiments.

FIG. 6 is a diagram for explaining the function of the adjusting power measuring apparatus according to one or more embodiments.

The specific processing executed by the adjusting power measuring apparatus 10, in accordance with one or more embodiments, will be described in detail with reference to FIGS. 5-6. In the following descriptions, the processing by the power source 21 will be explained as an example of the processing by the power sources 21, 22, etc. managed by the power generation company G.

The processing flow shown in FIG. 5 is continuously executed by the adjusting power measuring apparatus 10 (CPU 100) having the aforementioned functions.

First, the measurement value acquiring unit 1000 acquires the active power measurement values $P_1$ and the frequency measurement values $f_1$ at the connection point between the power source 21 and the targeted power grid N1 via the measuring instrument 50 (Step S00). The measuring instrument 50 samples the active power exchanged at the connection point and the frequency at the connection point at a predetermined sampling period (e.g., a period of several hundred milliseconds). The measurement value acquiring unit 1000 successively acquires, as time series data, the active power measurement values $P_1$ and the frequency measurement values $f_1$ that the measuring instrument 50 acquires at the sampling period. In the following descriptions, the active power measurement value $P_1$ and the frequency measurement value $f_1$ acquired at time "t" are represented as active power measurement value $P_1$ (t) and frequency measurement value $f_1$ (t), respectively.

Next, the adjusting power coefficient calculating unit 1001 calculates the first adjusting power coefficient $k_{p1}$ based on (i) a plurality of active power measurement values $P_1$ (t) respectively acquired at each point (each time "t") in time in the past within a predetermined time period (e.g., 30 minutes) from the current time and (ii) a plurality of frequency measurement values $f_1$ (t) respectively acquired at each time "t" in the past within the predetermined time period from the current time. Specifically, the adjusting power coefficient calculating unit 1001 calculates Formula (2) below to obtain the first adjusting power coefficient $k_{p1}$.

[Formula 2]

$$k_{p1} = \frac{\int \Delta P_1(t) \cdot \Delta f_1(t) dt}{\int \Delta f_1(t)^2 dt} \quad (2)$$

In Formula (2), "$\Delta P_1$ (t)" indicates an active power fluctuation measurement value, and "$\Delta f_1$ (t)" indicates a frequency fluctuation measurement value. The active power fluctuation measurement value $\Delta P_1$ (t) and the frequency fluctuation measurement value $\Delta f_1$ (t) are obtained by calculating Formula (3) and Formula (4) using the active power measurement values $P_1$ (t) and the frequency measurement values $f_1$ (t), respectively.

[Formula 3]

$$\Delta P_1(t) = P_1(t) - E[P_1] \quad (3)$$

[Formula 4]

$$\Delta f_1(t) = f_1(t) - E[f_1] \quad (4)$$

In Formula (3), "E [$P_1$]" indicates an average value of the active power measurement values $P_1$ (t) respectively acquired at each time "t" in the past within a predetermined time period (e.g., 30 minutes) from the current time. Thus, the adjusting power coefficient calculating unit 1001 obtains, as the active power fluctuation measurement value $\Delta P_1$ (t), a deviation between the average value E [$P_1$] of the active power measurement values $P_1$ (t) acquired within the predetermined time period and a newly-acquired active power measurement value $P_1$ (t).

In Formula (4), "E [$f_1$]" indicates an average value of the frequency measurement values $f_1$ (t) respectively acquired at each time "t" in the past within a predetermined time period (e.g., 30 minutes) from the current time. Thus, the adjusting power coefficient calculating unit 1001 obtains, as the frequency fluctuation measurement value $\Delta f_1$ (t), a deviation between the average value E [$f_1$] of the frequency measurement values $f_1$ (t) acquired within the predetermined time period and a newly-acquired frequency measurement value $f_1$ (t).

The first adjusting power coefficient $k_{p1}$ calculated by Formula (2) will be described with reference to FIG. 6.

The graph illustrated in FIG. 6 is a scatter diagram in which combinations of the active power fluctuation measurement value $\Delta P_1$ (t) and the frequency fluctuation measurement value $\Delta f_1$ (t) each acquired at the same time within the predetermined time period are plotted.

According to GF operation, ideally, the relationship between the fluctuation in the frequency and the fluctuation (adjusting power) in the active power should conform to Formula (1). However, errors occur due to time delay of the output from the power source 21 and the like, as described above.

Meanwhile, a slope of a regression line W of the plots (actual values), namely, the first adjusting power coefficient $k_{p1}$ [W/Hz] obtained by Formula (2), is an amount indicating to what extent the frequency fluctuation at the connection point is influenced by the fluctuation in the active power actually generated by the power source 21 at the connection point between the power source 21 and the targeted power grid N1. In other words, the adjusting power practically supplied from the power source 21 to the targeted power grid N1 can be acquired by applying the frequency fluctuation actually occurring at the connection point to the regression line W obtained based on the actual values at the connection points.

Referring back to FIG. 5, the adjusting power calculating unit 1002 then calculates adjusting power $\Delta P_{GF1}$ (t) that the power source 21 actually supplies to the targeted power grid N1 based on the first adjusting power coefficient $k_{p1}$ calculated by the adjusting power coefficient calculating unit 1001 and the frequency fluctuation measurement value $\Delta f_1$ (t) (Step S02). Specifically, the adjusting power calculating unit 1002 calculates Formula (5) to obtain the adjusting power $\Delta P_{GF1}$ (t).

[Formula 5]

$$\Delta P_{GF1} = k_{p1} |\Delta f_1(t)| \quad (5)$$

In FIG. 5, "$\Delta P_{GF1}$ (t)" indicates the adjusting power that the power source 21 supplies to the targeted power grid N1, which is an estimated value of the fluctuation in the active power obtained by substituting the frequency fluctuation measurement value $\Delta f_1$ (t) for the regression line W shown in FIG. 6. When the frequency exceeds the reference value, the decrease (change in the negative direction) of the active power contributing to the change of the frequency in the negative direction is also considered as the adjusting power. For this reason, the first adjusting power coefficient $k_{p1}$ is multiplied by an absolute value of $\Delta f_1$ (t) in Formula (5).

Next, the integrated value calculating unit 1003 calculates the adjusting power integrated value $S_1$ for a predetermined unit period (e.g., 24 hours) by integrating the adjusting powers $\Delta P_{GF1}$ (t). The adjusting powers $\Delta P_{GF1}$ (t) is successively calculated, using Formula (5), by the adjusting power calculating unit 1002 over the predetermined unit period (Step S03). Specifically, the integrated value calculating unit 1003 calculates Formula (6).

[Formula 6]

$$S_1 = \int_{t_{initial}}^{t_{terminal}} \Delta P_{GF1}(t) dt \quad (6)$$

In Formula (6), "$S_1$" indicates the integrated value (adjusting power integrated value) of the adjusting powers $\Delta P_{GF1}$ (t) supplied by the power source 21 within a time period from time $t_{initial}$ to time $t_{terminal}$. In one or more embodiments, $t_{initial}$ is 0 o'clock on a certain working day of the power source 21, and $t_{terminal}$ is 24 o'clock (0 o'clock on the next day) on the working day. In this case, the adjusting power integrated value $S_1$ is the total amount of the adjusting power supplied by the power source 21 throughout the working day.

Next, the settlement processing unit 1004 calculates the compensation for the adjusting power integrated value $S_1$ calculated by the integrated value calculating unit 1003 (Step S04). Specifically, the settlement processing unit 1004 calculates Formula (7).

[Formula 7]

$$Y_1 = \gamma_1 \kappa S_1 \quad (7)$$

In Formula (7), "$\kappa$" indicates a coefficient for converting the adjusting power integrated value $S_1$ calculated in a unit of [J] (joule) into a unit of [kWh] (kilowatt-hour), and "$\gamma_1$" indicates the contract unit price according to the agreement between the transmission and distribution company T and the power generation company G, which is an amount of compensation per unit adjusting power. The contract unit price $\gamma_1$ refers to a contract unit price regarding the adjusting power supplied by the power source 21. "$Y_1$" indicates a total compensation for the adjusting power that the power source 21 of the transmission and distribution company T supplies throughout the working day (from 0 o'clock to 24 o'clock).

The adjusting power measuring apparatus 10 also executes the same processing (Steps S00-S04) above with respect to other power sources 22, 23, etc. owned by the power generation company G. The contract unit prices $\gamma_1$, $\gamma_2$, $\gamma_3$, etc. corresponding to the power sources 21, 22, 23, etc., respectively, can be determined differently from one another depending on the standards/specifications of the power sources 21, 22, 23, etc.

The adjusting power measuring apparatus 10 may give notice of the compensation for the adjusting power supplied from the power generation companies G to an information processing apparatus of each of the power generation companies G. The transmission and distribution company T pays the compensation for the adjusting power supplied within the predetermined period according to a contract between the transmission and distribution company T and each of the power generation companies G.

According to one or more embodiments, the adjusting power measuring apparatus 10 having the aforementioned structure and functions directly monitors the fluctuation in the active power and the fluctuation in the frequency occurring at the connection points between the power sources 21, 22, etc. managed by the power generation companies G and the targeted power grid N1. The adjusting power measuring apparatus 10 also calculates, as the first adjusting power coefficient $k_{p1}$, the degree of influence that the active power fluctuation occurring at the connection point has on the frequency fluctuation. As a result, the size of fluctuation of the active power (i.e., the adjusting power supplied by the power sources 21, 22, etc. that caused the frequency fluctuation actually occurring at the connection point) can be estimated. The estimated adjusting power contains the adjusting power supplied by GF operation autonomously performed by the power sources (power sources 21, 22, etc.) in turbine systems and/or inertia.

As described above, the adjusting power measuring apparatus 10 of one or more embodiments and the adjusting power measuring system 1 comprising the apparatus 10 can measure the adjusting power actually supplied by the adjusting power supply source (power sources 21, 22, etc.).

Although the adjusting power measuring apparatus 10 of the aforementioned embodiments is managed by the transmission and distribution company T, the apparatus 10 may be managed by other companies.

(Measurement of Adjusting Power Supplied by Consumer)

Figure 7:
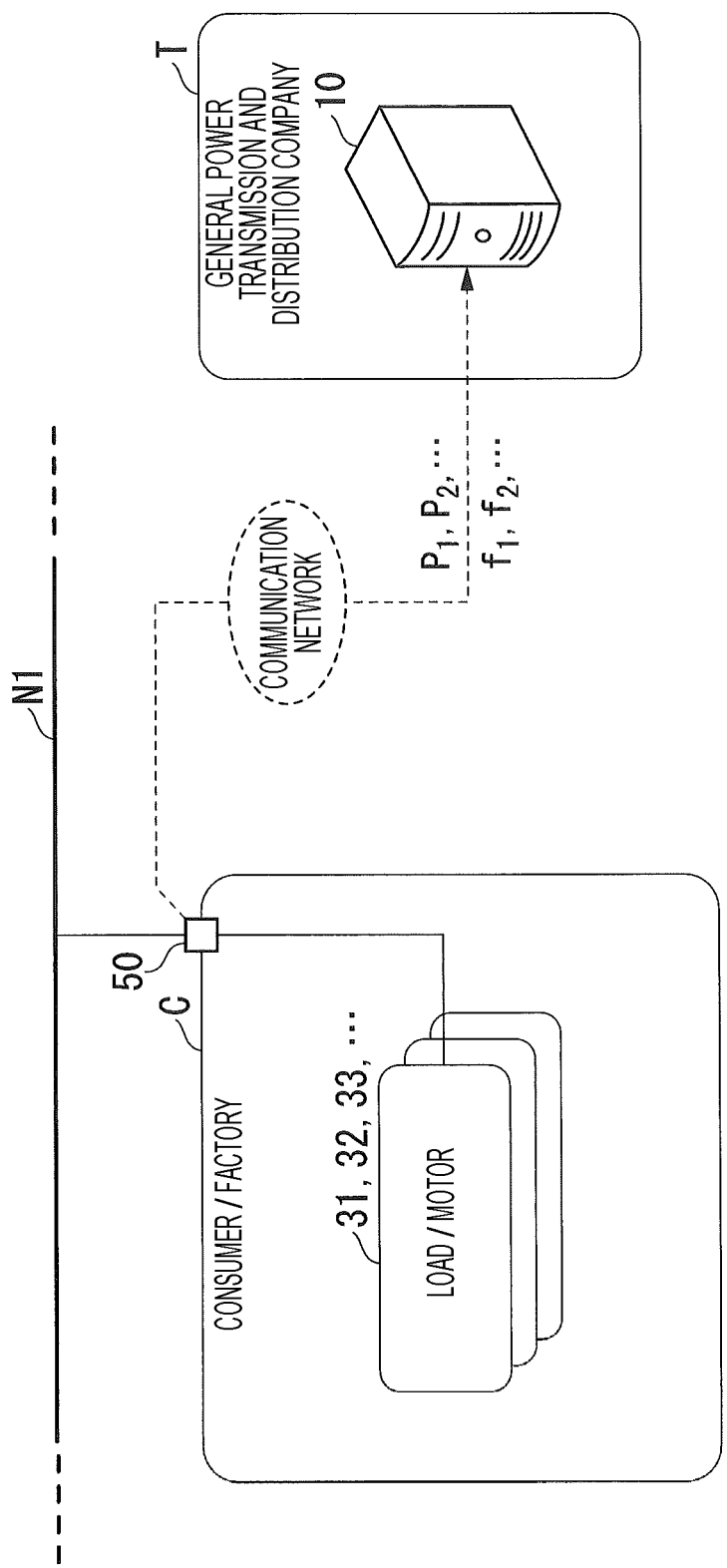
FIG. 7 is a second diagram illustrating in detail the structure of the adjusting power measuring system according to one or more embodiments.

FIG. 7 is a second diagram illustrating in detail the structure of the adjusting power measuring system according to one or more embodiments.

Measurement of the adjusting power that the consumer C supplies to the targeted power grid N1 will be described with reference to FIG. 7.

As illustrated in FIG. 7, the consumer C manages a plurality of loads 31, 32, 33, etc. In one or more embodiments, the consumer C is a factory and the loads 31, 32, 33, etc. are motors or the like.

The loads 31, 32, etc. consume the active power supplied from the targeted power grid N1 to drive facilities owned by the consumer C.

The measuring instrument 50 is installed at a connection point between the targeted power grid N1 and each of the loads 31, 32, etc. and is capable of measuring active power measurement values $P_1$, $P_2$, etc. of the active power exchanged at the connection point and frequency measurement values $f_1$, $f_2$, etc. at the connection point. The active power measurement values $P_1$, $P_2$, etc. and the frequency measurement values $f_1$, $f_2$, etc. obtained by the measuring instrument 50 are successively transmitted to the adjusting power measuring apparatus 10 via a predetermined communication network.

The adjusting power measuring apparatus 10 executes the processing (Steps S00-S04) shown in FIG. 5 based on the active power measurement values $P_1$, $P_2$, etc. and the frequency measurement values $f_1$, $f_2$, etc. obtained via the measuring instrument 50 shown in FIG. 7. Then, the adjusting power measuring apparatus 10 calculates the adjusting power that the loads 31, 32, etc. supply to the targeted power grid N1 and the amount of compensation therefor.

Thus, the adjusting power supplied from the consumer C to the targeted power grid N1 is calculated in accordance with the operations of the loads 31, 32, etc. In this case, the adjusting power that the consumer C unintentionally supplies is also measured. By obtaining the active power measurement values $P_1$, $P_2$, etc. exchanged between the loads 31, 32, etc. managed by the consumer C and the targeted power grid N1 and the frequency measurement values $f_1$, $f_2$, etc. and executing calculation of Steps S01-S04, the compensation for the supplied adjusting power can be paid for not only the power generation companies G but also the consumer who drives the loads.

(Measurement of Adjusting Power Supplied by Another Transmission and Distribution Company)

Figure 8:
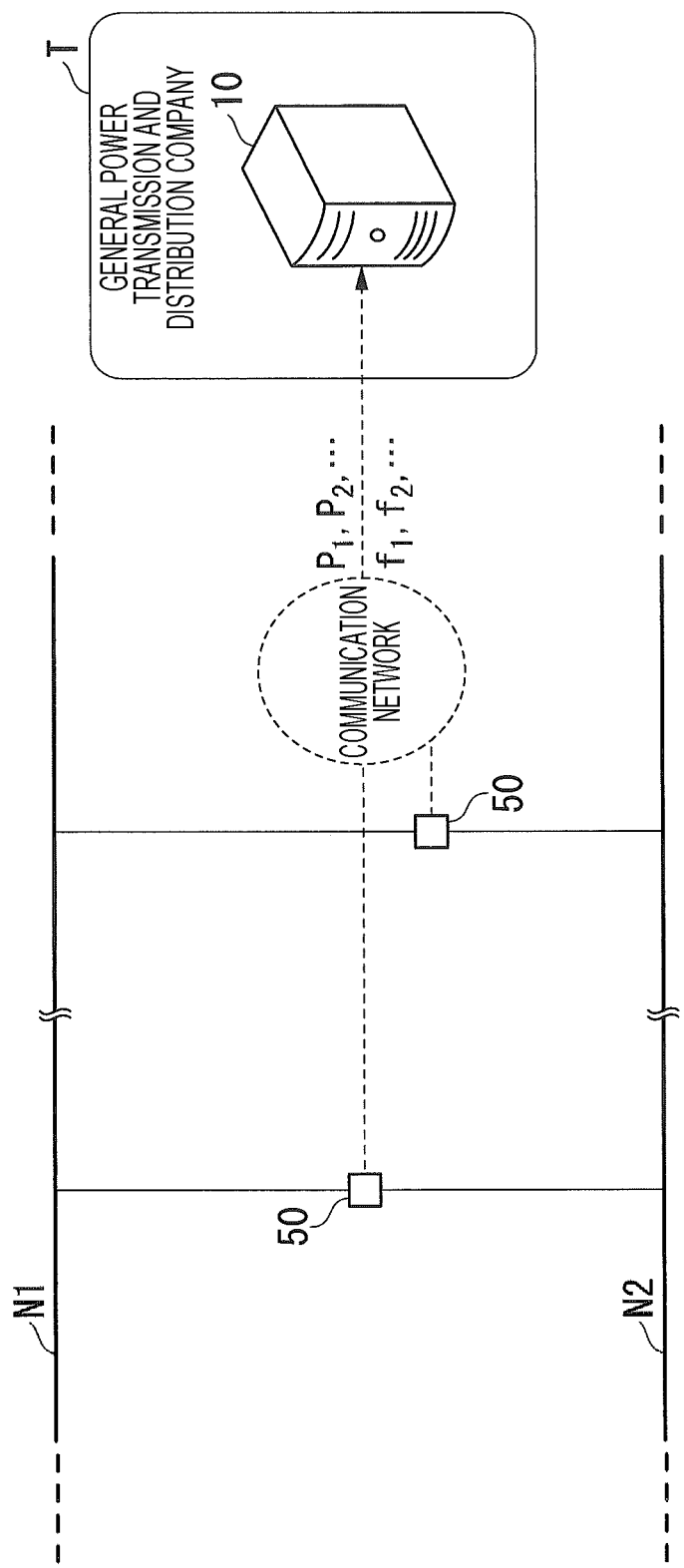
FIG. 8 is a third diagram illustrating in detail the structure of the adjusting power measuring system according to one or more embodiments.

FIG. 8 is a third diagram illustrating in detail the structure of the adjusting power measuring system according to one or more embodiments.

Measurement of the adjusting power supplied from another transmission and distribution company to the targeted power grid N1 will be described with reference to FIG. 8.

As illustrated in FIG. 8, the power grid (untargeted power grid N2) managed by another transmission and distribution company is connected to the targeted power grid N1 at one or more points, and constitutes a network of transmission and distribution.

The measuring instrument 50 is installed at the connection point between the targeted power grid N1 and each of the loads 31, 32, etc., and is capable of measuring active power measurement values $P_1$, $P_2$, etc. of the active power exchanged at the connection point and frequency measurement values $f_1$, $f_2$, etc. at the connection point. The active power measurement values $P_1$, $P_2$, etc. and the frequency measurement values $f_1$, $f_2$, etc. obtained by the measuring instrument 50 are successively transmitted to the adjusting power measuring apparatus 10 via a predetermined communication network.

The adjusting power measuring apparatus 10 executes the processing (Steps S00-S04) shown in FIG. 5 based on the active power measurement values $P_1$, $P_2$, etc. and the frequency measurement values $f_1$, $f_2$, etc. obtained via the measuring instruments 50 shown in FIG. 8. Then, the adjusting power measuring apparatus 10 calculates the adjusting power supplied from the untargeted power grid N2 to the targeted power grid N1 and an amount of compensation therefor.

Thus, the adjusting power supplied from the transmission and distribution company managing the untargeted power grid N2 to the targeted power grid N1 is measured. By obtaining the active power measurement values $P_1$, $P_2$, etc. exchanged between a total power grid (untargeted power grid N2) managed by another transmission and distribution company and the targeted power grid N1 and the frequency measurement values $f_1$, $f_2$, etc. and executing calculation of Steps S01-S04, the compensation for the supplied adjusting power can be paid to not only the power generation companies G and the consumers C but also to the other transmission and distribution company.

<Variations of One or More Embodiments>

The adjusting power measuring apparatus 10 and the adjusting power measuring system 1 according to one or more embodiments are described above, but details thereof are not limited to the aforementioned embodiments, and various design changes can be added without departing from the gist of the present invention.

Variations of one or more embodiments will be described with reference to FIG. 9.

(Function of Adjusting Power Measuring Apparatus)

Figure 9:
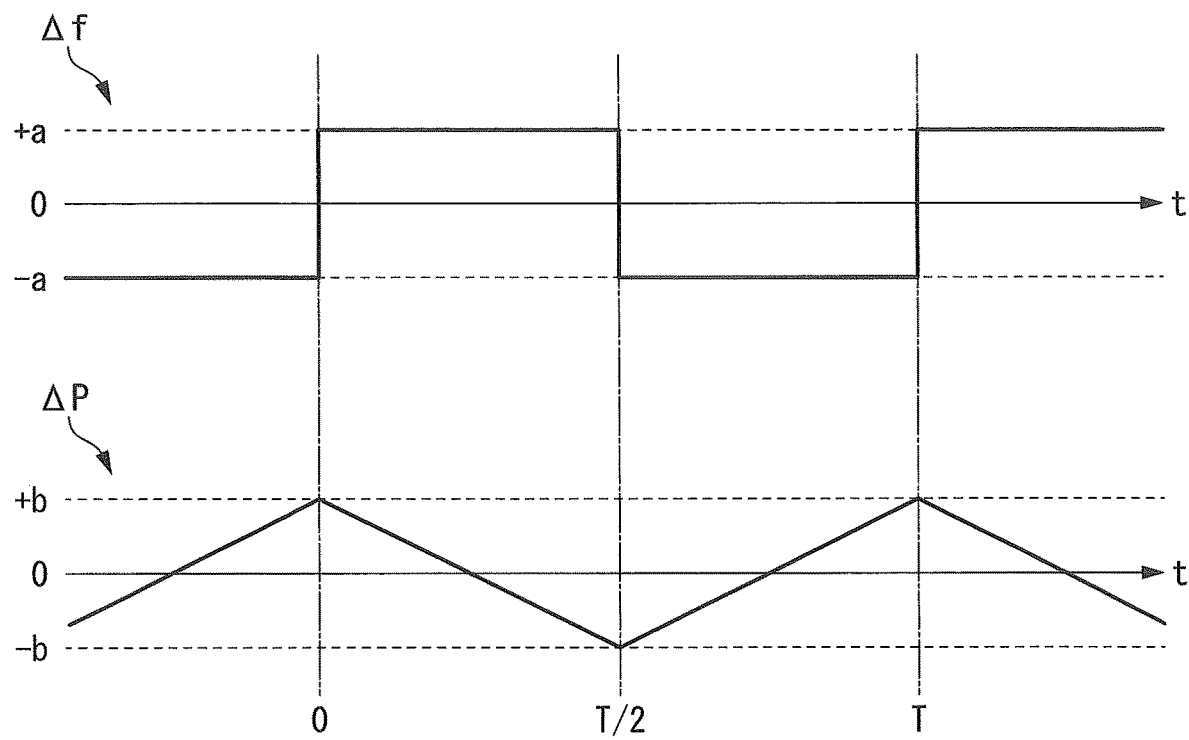
FIG. 9 is a diagram for explaining a function of an adjusting power measuring apparatus according to variations of one or more embodiments.

FIG. 9 is a diagram for explaining a function of an adjusting power measuring apparatus according to variations of one or more embodiments.

The adjusting power coefficient calculating unit 1001 according to the variations calculates a second adjusting power coefficient $k_{f1}$ based on the active power measurement value $P_1(t)$ and the frequency measurement value $f_1(t)$ in the processing of Step S01 in FIG. 5. Specifically, the adjusting power coefficient calculating unit 1001 of the variations calculates Formula (8) to obtain the second adjusting power coefficient $k_{f1}$.

[Formula 8]

$$k_{f1} = \frac{\int (\Delta P_1(t) \cdot \int \Delta f_1(t)dt) dt}{\int (\int \Delta f_1(t)dt)^2 dt} \quad (8)$$

In Formula (8), "$\int \Delta f_1(t) dt$" indicates a frequency fluctuation integrated value of the frequency fluctuation measurement value $\Delta f_1$ (t). The second adjusting power coefficient $k_{f1}$ obtained by Formula (8) indicates a degree of influence that the active power fluctuation occurring at the connection point (each of positions at which the measurement instruments 50 are installed) has on "the integrated value of the frequency fluctuation" at the connection point.

The adjusting power calculating unit 1002 according to the variations calculates adjusting power $\Delta P_{GF1}$ (t) based on the second adjusting power coefficient $k_{f1}$ calculated by the adjusting power coefficient calculating unit 1001 in the processing of Step S02 in FIG. 5. Specifically, the adjusting power calculating unit 1002 calculates Formula (9) to obtain the adjusting power $\Delta P_{GF1}$ (t).

[Formula 9]

$$\Delta P_{GF1}(t) = k_{f1} |\int \Delta f_1(t) dt| \quad (9)$$

The adjusting power measuring apparatus 10 of the variations calculates the adjusting power based on Formula (8) and Formula (9), and thus obtains effects described below.

For example, it is premised that the frequency shift $\Delta f$ fluctuates stepwise with amplitude "a" and period "T" at a certain connection point (see FIG. 9). It is also premised that the active power fluctuation $\Delta P$ at the certain connection point changes in a ramp wise manner with amplitude "b" and period "T" in response to the frequency shift $\Delta f$ (see FIG. 9). Incidentally, the active power fluctuation $\Delta P$ shown in FIG. 9 is based on Integral control (I control) with respect to the frequency shift $\Delta f$.

The calculation result of the first adjusting power coefficient $k_{p1}$ (Formula (2)) with respect to the fluctuations shown in FIG. 9 becomes zero ($k_{p1}=0$) as shown in Formula (10).

[Formula 10]

$$k_{p1} = \frac{a \cdot (-b+b) \cdot \frac{T}{2} - a \cdot (b-b) \cdot \frac{T}{2}}{\int_0^{\frac{T}{2}} a^2 dt + \int_{\frac{T}{2}}^T (-a)^2 dt} = 0 \quad (10)$$

Meanwhile, the calculation result of the second adjusting power coefficient $k_{f1}$ (Formula (8)) with respect to the fluctuations shown in FIG. 9 becomes a finite value ($k_{f1}=b/a$) as shown in Formula (11).

[Formula 11]

$$k_{f1} = \frac{\int_0^{\frac{T}{2}} \frac{4a}{T}(t - \frac{T}{4}) \cdot \frac{4b}{T}(t - \frac{T}{4}) dt + \int_{\frac{T}{2}}^T \frac{4a}{T}(\frac{3T}{4} - t) \cdot \frac{4b}{T}(\frac{3T}{4} - t) dt}{\int_0^{\frac{T}{2}} (\frac{4a}{T}(t - \frac{T}{4}))^2 dt + \int_{\frac{T}{2}}^T (\frac{4a}{T}(\frac{3T}{4} - t))^2 dt} = \frac{b}{a} \quad (11)$$

Thus, the method of measuring the adjusting power based on the first adjusting power coefficient $k_{p1}$ (Formula (2)) might not accurately measure the adjusting power generated by the adjusting power supply source (e.g., the power source 21) based on the Integrated control with respect to the frequency shift $\Delta f$. However, measuring the adjusting power using also the second adjusting power coefficient $k_{f1}$ enables accurately measuring the adjusting power generated by the adjusting power supply source based on the Integrated control with respect to the frequency shift $\Delta f$.

The measurement instrument of one or more embodiments and the adjusting power measuring system comprising the measurement instrument will be described with reference to FIGS. 10-13.

(Structure of Adjusting Power Measuring System)

Figure 10:
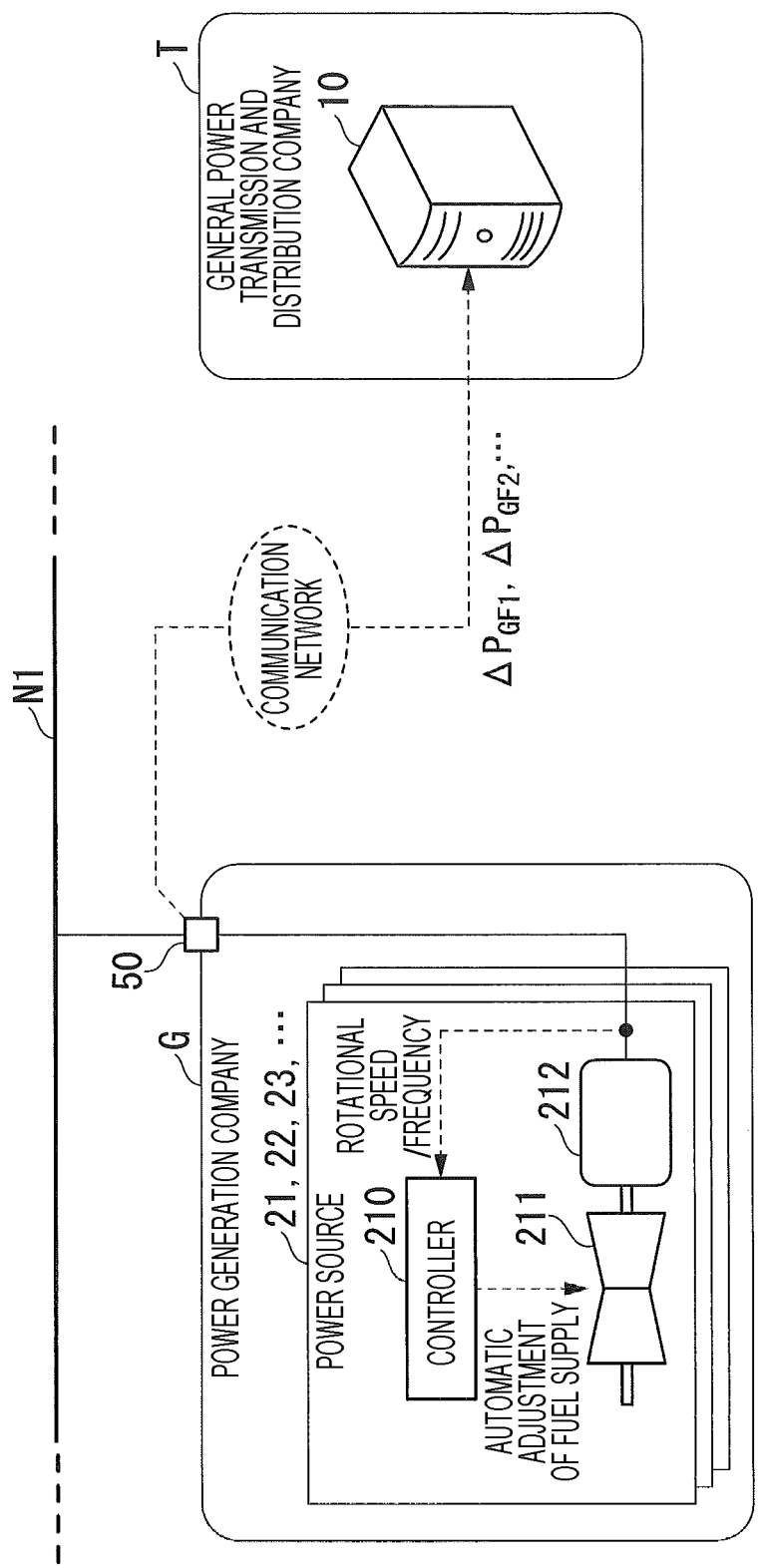
FIG. 10 is a diagram for illustrating in detail a structure of an adjusting power measuring system according to one or more embodiments.

FIG. 10 is a diagram for illustrating in detail a structure of an adjusting power measuring system according to one or more embodiments.

As with the aforementioned embodiments, the measuring instrument 50 of one or more embodiments is installed at the connection point between the adjusting power supply source (e.g., the power source 21) and the targeted power grid N1. In this regard, however, the measuring instrument 50 of one or more embodiments executes calculation processing to the obtained actual values (active power fluctuation measurement values $\Delta P_1$, $\Delta P_2$, etc. and frequency fluctuation measurement values $\Delta f1$, $\Delta f2$, etc.), and outputs the adjusting powers $\Delta P_{GF1}$, $\Delta P_{GF2}$, etc. as the calculation results to the transmission and distribution company T.

The adjusting power measuring apparatus 10 of one or more embodiments may comprise only the integrated value calculating unit 1003 and the settlement processing unit 1004 among functional components shown in FIG. 4. The adjusting power measuring apparatus 10 of one or more embodiments integrates the adjusting powers $\Delta P_{GF1}$, $\Delta P_{GF2}$, etc. received from the measuring instrument 50, and performs the settlement processing based on the integrated result.

(Hardware Configuration of Measuring Instrument)

Figure 11:
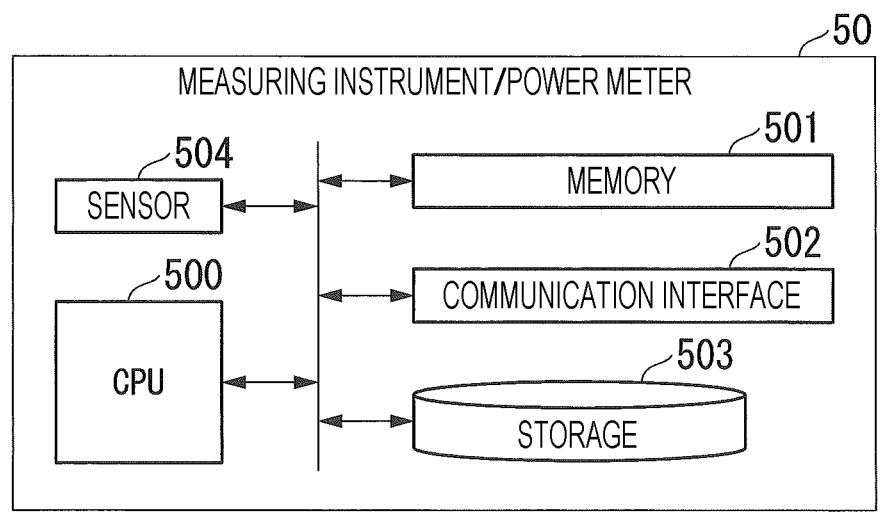
FIG. 11 is a block diagram illustrating a hardware configuration of a measuring instrument according to one or more embodiments.

FIG. 11 is a block diagram illustrating a hardware configuration of a measuring instrument according to one or more embodiments.

As illustrated in FIG. 11, the measuring instrument 50 comprises a processor (CPU) 500, memory 501, communication interface 502, storage 503, and sensor 504.

The CPU 500 is a processor that controls the overall operations of the measuring instrument 50.

The memory 501 is a main memory, in which instructions and data for the CPU 500 to operate according to programs are expanded.

The communication interface 502 is an interface device for exchanging information with an external device/apparatus (especially the adjusting power measuring apparatus 10).

In one or more embodiments, communication means and methods realized by the communication interface 502 are not particularly limited.

The storage (recording medium) 503 is an auxiliary storage device incorporated in the measuring instrument 50, and may be a Hard Disk Drive (HDD), Solid State Drive (SSD), or the like.

The sensor 504 is a measuring member that measures the active power and the frequency at the connection point between the adjusting power supply source (e.g., the power source 21) and the targeted power grid N1 shown in FIG. 10.

(Functional Composition of Measuring Instrument)

Figure 12:
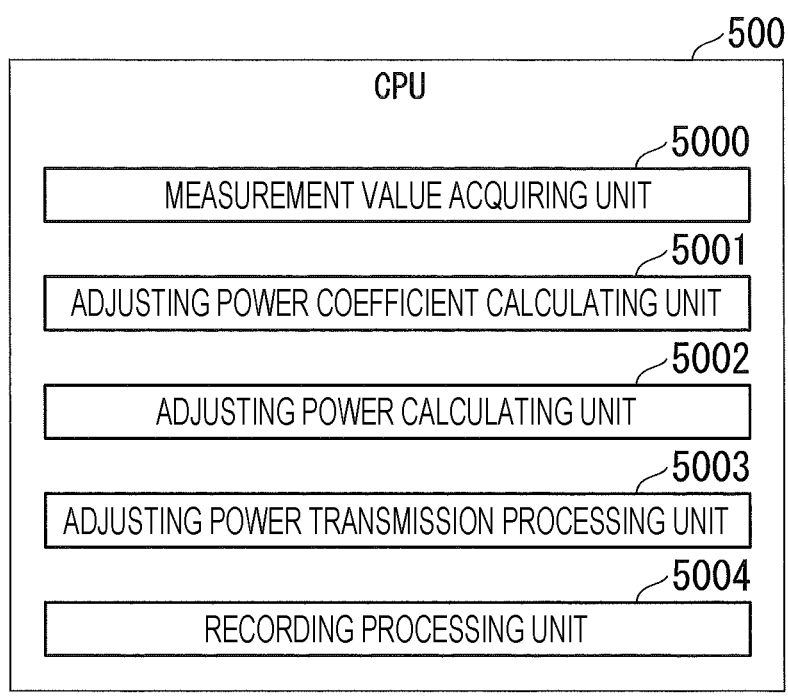
FIG. 12 is a block diagram illustrating a functional composition of the measuring instrument according to one or more embodiments.

FIG. 12 is a block diagram illustrating a functional composition of the measuring instrument according to one or more embodiments.

As illustrated in FIG. 12, the CPU 500 of the measuring instrument 50 operates according programs to function as a measurement value acquiring unit 5000, adjusting power coefficient calculating unit 5001, adjusting power calculating unit 5002, adjusting power transmission processing unit 5003, and recording processing unit 5004.

As the measurement value acquiring unit 5000, adjusting power coefficient calculating unit 5001, and adjusting power calculating unit 5002 has the same functions as those of the measurement value acquiring unit 1000, adjusting power coefficient calculating unit 1001, adjusting power calculating unit 1002, the detailed descriptions thereof are omitted.

The adjusting power transmission processing unit 5003 successively transmits the adjusting powers $\Delta P_{GF1}$, $\Delta P_{GF2}$, etc. calculated by the adjusting power calculating unit 5002 to the adjusting power measuring apparatus 10.

The recording processing unit 5004 successively records, in addition to the active power measurement values $P_1$, $P_2$, etc. and the frequency measurement values $f_1$, $f_2$, etc., the first adjusting power coefficients $k_{p1}$, $k_{p2}$, etc. calculated by the adjusting power coefficient calculating unit 5001 and the adjusting powers $\Delta P_{GF1}$, $\Delta P_{GF2}$, etc. calculated by the adjusting power calculating unit 5002 in the storage 503 to accumulate them.

(Processing Flow)

Figure 13:
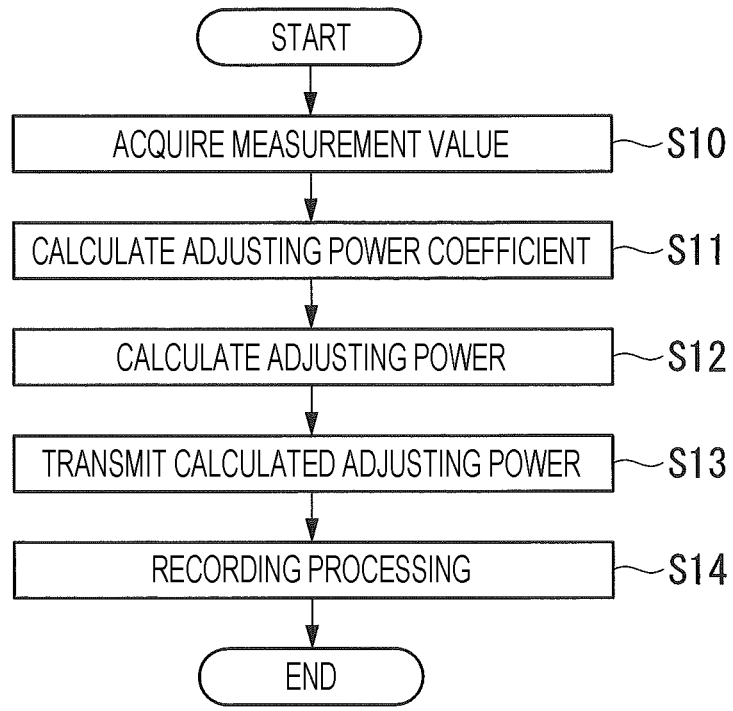
FIG. 13 is a flowchart illustrating processing by the measuring instrument according to one or more embodiments.

FIG. 13 is a flowchart illustrating processing by the measuring instrument according to one or more embodiments.

The processing shown in FIG. 13 is continuously executed by the measuring instrument 50 (CPU 500) having the aforementioned functions. Hereinafter the power source 21 will be explained as an example of the power sources 21, 22, 23, etc. managed by the power generation company G.

As the processing of Steps S10-S12 in FIG. 13 is same as the processing (Steps S00-S02 in FIG. 5) by the adjusting power measuring apparatus 10 of the aforementioned embodiments, the detailed descriptions thereof are omitted.

After the processing of Step S12, the adjusting power transmission processing unit 5003 transmits the adjusting power $\Delta P_{GF1}$ (t) calculated in Step S12 to the adjusting power measuring apparatus 10 (Step S13).

The recording processing unit 5004 records the active power measurement values $P_1$ (t) and the frequency measurement values $f_1$ (t) acquired in Step S10, the first adjusting power coefficient $k_{p1}$ calculated in Step S11, and the adjusting power $\Delta P_{GF1}$ (t) calculated in Step S12 in the storage 503 (Step S14).

As described above, the measuring instrument 50 of one or more embodiments has the function to successively calculate the adjusting powers $\Delta P_{GF1}$, $\Delta P_{GF2}$, etc., and the function to successively record these adjusting powers to leave the history thereof. By keeping the record of the calculated adjusting powers, the adjusting powers can be measured even when a trouble occurs in communication with the adjusting power measuring apparatus 10.

Although the measuring instrument 50 calculates and transmits the adjusting powers and the adjusting power measuring apparatus 10 integrates the adjusting powers and performs the settlement processing (calculation of the amount of compensation for the supply of the adjustment power) in the aforementioned embodiments, the present invention is not limited to these embodiments.

For example, in one or more embodiments, the measuring instrument 50 may execute all the processing (Steps S00-S04 in FIG. 5) including the settlement processing.

Next, the adjusting power measuring apparatus of one or more embodiments and the adjusting power measuring system comprising the apparatus will be described with reference to FIGS. 14-17.

(Function of Adjusting Power Measuring Apparatus)

Figure 14:
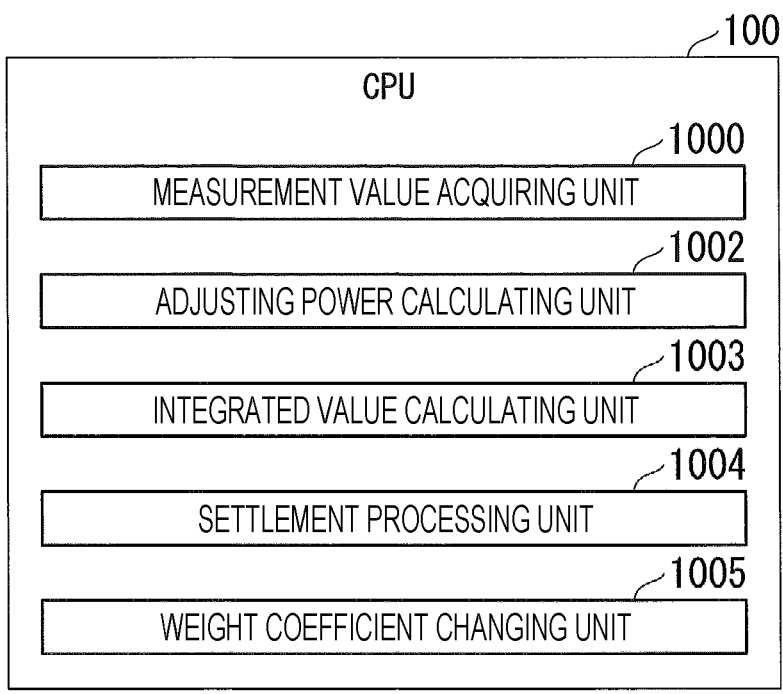
FIG. 14 is a block diagram illustrating a functional composition of the adjusting power measuring apparatus according to one or more embodiments.

FIG. 14 is a block diagram illustrating a functional composition of the adjusting power measuring apparatus according to one or more embodiments.

As illustrated in FIG. 14, the CPU 100 of the adjusting power measuring apparatus 10 operates according to programs to function as a measurement value acquiring unit 1000, adjusting power calculating unit 1002, integrated value calculating unit 1003, settlement processing unit 1004, and weight coefficient changing unit 1005. As the measurement value acquiring unit 1000, integrated value calculating unit 1003, and settlement processing unit 1004 have the same functions as those of the aforementioned embodiments, the descriptions thereof are omitted. In one or more embodiments, the adjusting power coefficient calculating unit 1001 of the aforementioned embodiments may be omitted.

The adjusting power calculating unit 1002 calculates the adjusting powers $dP_{GF1}$, $dP_{GF2}$, etc. supplied from the power sources 21, 22, etc. to the targeted power grid N1 based on the active power measurement values $P_1$, $P_2$, etc. and the frequency measurement values $f_1$, $f_2$, etc. acquired by the measurement value acquiring unit 1000 and aftermentioned weight coefficients "w" previously stored in the storage 103.

The weight coefficient changing unit 1005 changes weight coefficients "w" stored in the storage 103 based on values input by a manager of the transmission and distribution company T or the like via a not-illustrated input device of the adjusting power measuring apparatus 10.

(Processing Flow of Adjusting Power Measuring Apparatus)

Figures 15, 16:
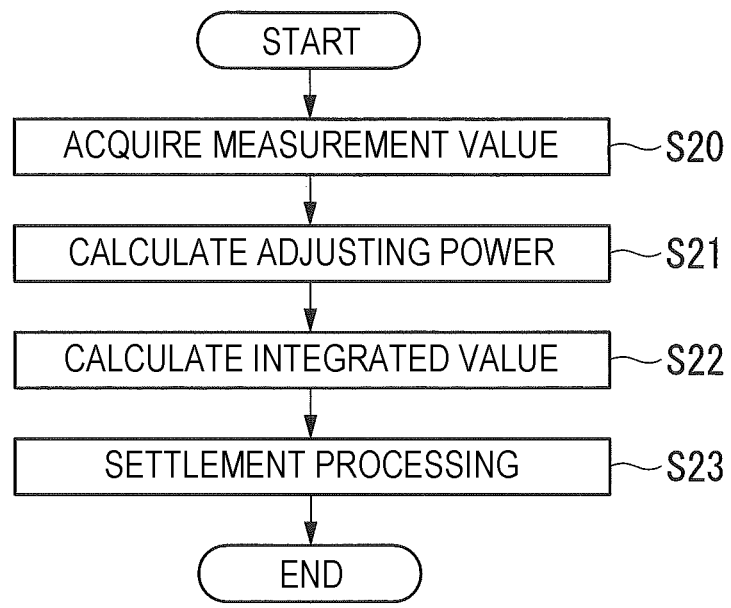
FIG. 15 is a flowchart illustrating processing by the adjusting power measuring apparatus according to one or more embodiments.
FIG. 16 is a diagram illustrating examples of weight coefficients according to one or more embodiments.

FIG. 15 is a flowchart illustrating processing by the adjusting power measuring apparatus according to one or more embodiments.

FIG. 16 is a diagram illustrating examples of weight coefficients according to one or more embodiments.

The specific processing executed by the adjusting power measuring apparatus 10 of one or more embodiments will be described in detail with reference to FIGS. 15-16. Hereinafter the power source 21 will be explained as an example of the power sources 21, 22, 23, etc. managed by the power generation company G.

As the processing of Step S20 in FIG. 15 is same as the processing (Step S00 in FIG. 5) by the adjusting power measuring apparatus 10 of the aforementioned embodiments, the detailed descriptions thereof are omitted.

The adjusting power calculating unit 1002 calculates the adjusting power $dP_{GF1}$ (t) actually supplied from the power source 21 to the targeted power grid N1 based on the active power measurement value $P_1$ (t) and the frequency measurement value $f_1$ (t) acquired in Step S20 (Step S21).

Specifically, the adjusting power calculating unit 1002 calculates Formula (12) to obtain frequency fluctuation amount $df_{1w}(t)$ first.

[Formula 12]

$$df_{1w}(t) = \sum_{t_D=(0,1,2,3,4,\ldots,3600)} w(t_D)(f_1(t-t_D) - f_1(t-t_D-1)) \quad (12)$$

In Formula (12), "$df_{1w}(t)$" indicates a sum of values respectively obtained by multiplying a predetermined weight coefficient "w" with each fluctuation amount between two frequency measurement values $f_1$ acquired serially in time among a plurality of frequency measurement values $f_1$ (t) respectively acquired at each time "t" in the past within a predetermined time period (e.g., 1 hour) from the current time. The weight coefficient "w" is a coefficient for weighting responsiveness (output adjustment) with respect to frequency fluctuation of the power source 21. For example, as illustrated in FIG. 16, the storage 103 of the adjusting power measuring apparatus 10 previously stores a weight coefficient table D1. In the weight coefficient table D1 of one or more embodiments, the weight coefficients "w" are set for the delay times tD so that the weight with respect to the response of the power source 21 becomes largest at the current time (delay time tD=0) and becomes smaller as the time goes back to the past from the current time, namely, as the delay time tD becomes larger than zero (0).

The adjusting power calculating unit 1002 also calculates an output fluctuation amount $dP_1$ (t) of the power source 21 based on the active power measurement value $P_1$ (t) acquired at the current time and the active power measurement value $P_1$ (t-1) previously acquired. Specifically, the adjusting power calculating unit 1002 calculates Formula (13) to obtain the output fluctuation amount $dP_1$ (t).

[Formula 13]

$$dP_1(t) = P_1(t) - P_1(t-1) \quad (13)$$

Then, the adjusting power calculating unit 1002 obtains the adjusting power of the power source 21 based on the frequency fluctuation amount $df_{1w}$ (t) and the output fluctuation amount dP1 (t). Specifically, the adjusting power calculating unit 1002 determines that the output fluctuation amount dP1 (t) acts in a direction cancelling the frequency fluctuation when a product of the frequency fluctuation amount $df_{1w}(t)$ and the output fluctuation amount dP1 (t) is a "negative value." In this case, the adjusting power calculating unit 1002 calculates Formula (14) to obtain the adjusting power of the power source 21. Meanwhile, the adjusting power calculating unit 1002 determines that the output fluctuation amount dP1 (t) acts in a direction increasing the frequency fluctuation when a product of the frequency fluctuation amount $df_{1w}(t)$ and the output fluctuation amount dP1 (t) is a "positive value." In this case, the adjusting power calculating unit 1002 calculates Formula (15) to obtain the adjusting power of the power source 21.

[Formula 14]

$$dP_{GF1}(t) = |dP_1(t)| \quad (14)$$

[Formula 15]

$$dP_{GF1}(t) = -|dP_1(t)| \quad (15)$$

For example, when the frequency of the targeted power grid N1 lowers, positive active power is required as the adjusting power to maintain the frequency. If the power source 21 responds (supplies the positive active power) without delay from a point of time when the frequency lowers, this is effective and valuable for suppressing the frequency fluctuation in the targeted power grid N1. However, if the power source 21 responds with long delay (e.g., delay of 1 hour) from the point of time when the frequency lowers, there is a possibility that a degree of influence to suppression of the frequency fluctuation is low. Thus, high responsiveness of the power source 21 is important for maintaining the frequency of the targeted power gird N1.

Therefore, the adjusting power calculating unit 1002 of one or more embodiments makes the weight of the adjusting power in calculation large as the delay of the response by the power source 21 to the frequency fluctuation is small (i.e., the responsiveness is high), and makes the weight of the adjusting power in calculation small as the delay is large (i.e., the responsiveness is low), using the weight coefficient "w." As a result, the adjusting power calculating unit 1002 can enhance the value of the adjusting power as the responsiveness of the power source 21 is high.

Referring back to FIG. 15, the integrated value calculating unit 1003 calculates the adjusting power integrated value $S_1$ by integrating the adjusting powers $dP_{GF1}$ (t) successively calculated by the adjusting power calculating unit 1002 using Formula (14) or (15) over a predetermined unit period (e.g., 1 hour) (Step S22). This processing is same as the processing of Step S03 in FIG. 5 in the aforementioned embodiments.

The settlement processing unit 1004 calculates the compensation for the adjusting power integrated value $S_1$ calculated by the integrated value calculating unit 1003 (Step S23). This processing is same as the processing of Step S04 in FIG. 5 in the aforementioned embodiments.

The adjusting power measuring apparatus 10 successively executes a series of processing shown in FIG. 15, and thereby can calculate performance of the adjusting power of the power source 21 in real time.

As described above, in the adjusting power measuring apparatus 10 of one or more embodiments, the adjusting power calculating unit 1002 calculates the adjusting power supplied from the adjusting power supply source (the power sources 21, 22, etc.) to the targeted power grid N1 based on the fluctuation amount of the active power measurement value and the sum of the values respectively obtained by multiplying the predetermined weight coefficient "w" with each fluctuation amount between the two continuous (i.e., serially in time) frequency measurement values among the frequency measurement values acquired within the predetermined time period. By this, the adjusting power measuring apparatus 10 can calculate the adjusting power considering the delay time (responsiveness) of the response of the power sources 21, 22, etc. The adjusting power measuring apparatus 10 can also easily determine the value of the adjusting power using the weight coefficient "w" previously stored in the storage 103.

According to the adjusting power measuring apparatus 10 of one or more embodiments and the adjusting power measuring system 1 comprising the apparatus 10, it becomes possible to appropriately calculate the adjusting power actually supplied by the adjusting power supply source (the power sources 21, 22, etc.) depending on the responsiveness of the adjusting power supply source.

The values of the weight coefficients "w" in the weight coefficient table D1 may be arbitrary changed by the manager of the transmission and distribution company T or the like via the weight coefficient changing unit 1005. For example, with regard to the targeted power grid N1 really requiring high responsiveness, the degree of influence of responsiveness on the adjusting power may be increased by further increasing the weight coefficient "w" with respect to a region where the delay time tD is small. This can prompt participation of the power sources having high responsiveness.

(Measurement of Adjusting Power Supplied by Consumer)

The adjusting power measuring apparatus 10 of one or more embodiments executes the processing (Steps S20-S23) shown in FIG. 15 based on the active power measurement values $P_1$, $P_2$, etc. and the frequency measurement values $f_1$, $f_2$, etc. obtained via the measurement instruments 50 shown in FIG. 7, and calculates the adjusting power supplied from the loads 31, 32, etc. managed by the consumer C to the targeted power grid N1 and the amount of the compensation for the adjusting power.

By this, the adjusting power measuring apparatus 10 of one or more embodiments and the adjusting power measuring system 1 comprising the apparatus 10 can appropriately calculate also the adjusting power supplied from the loads 31, 32, etc. managed by the consumer C, depending on the responsiveness.

(Measurement of Adjusting Power Supplied by Another Transmission and Distribution Company)

The adjusting power measuring apparatus 10 of one or more embodiments executes the processing (Steps S20-S23) shown in FIG. 15 based on the active power measurement values $P_1$, $P_2$, etc. and the frequency measurement values $f_1$, $f_2$, etc. obtained via the measurement instruments 50 shown in FIG. 8, and calculates the adjusting power supplied from the untargeted power grid N2 to the targeted power grid N1 and the amount of the compensation for the adjusting power.

By this, the adjusting power measuring apparatus 10 of one or more embodiments and the adjusting power measuring system 1 comprising the apparatus 10 can appropriately calculate also the adjusting power supplied from the untargeted power grid N2 managed by another transmission and distribution company, depending on the responsiveness.

(Measurement of Adjusting Power of Stabilization Device)

Figure 17:
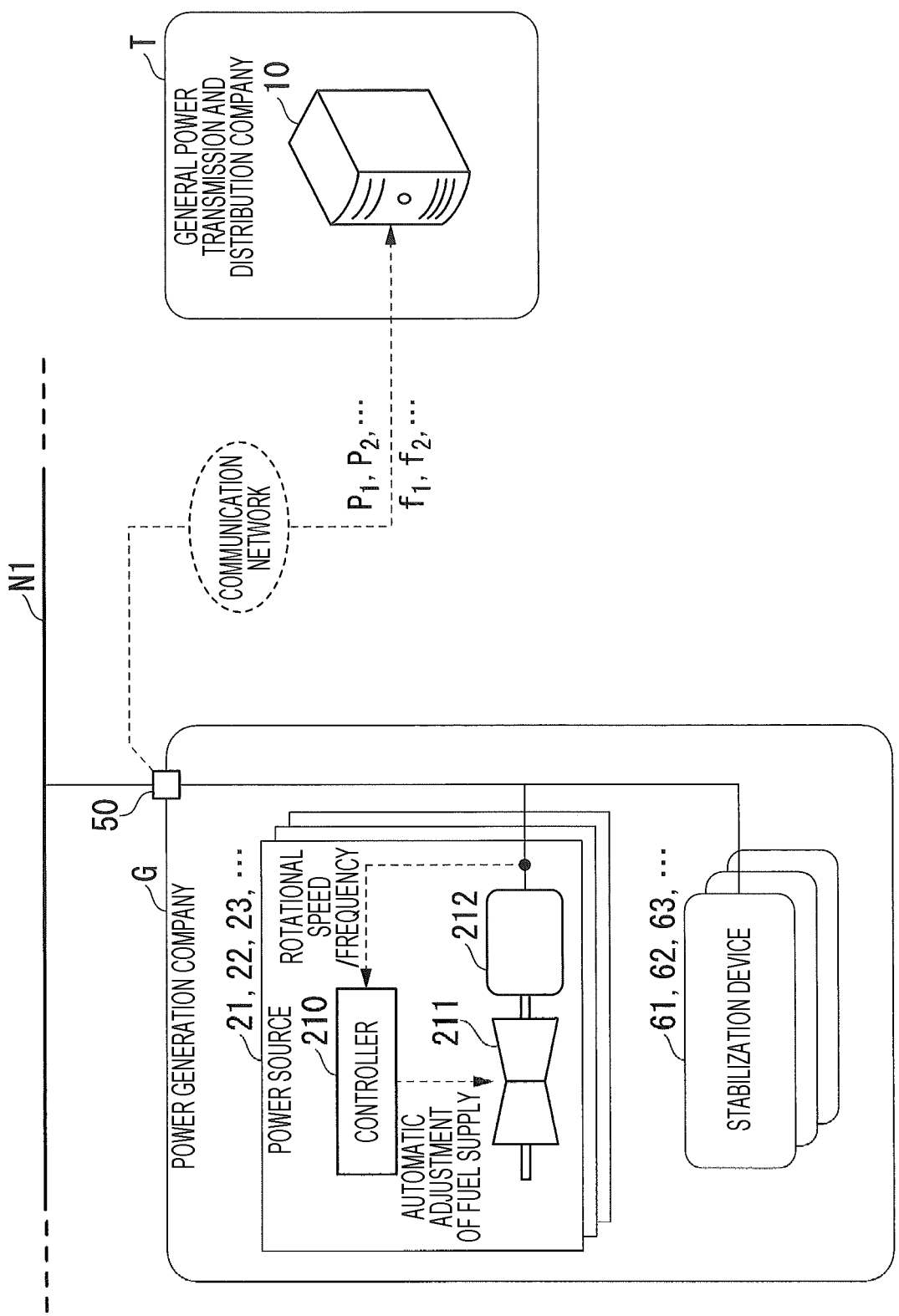
FIG. 17 is a diagram for illustrating in detail a structure of an adjusting power measuring system according to one or more embodiments.

FIG. 17 is a diagram for illustrating in detail a structure of an adjusting power measuring system according to one or more embodiments.

Measurement of the adjusting power supplied by the stabilization devices 61, 62, 63, etc. will be described with reference to FIG. 17.

As illustrated in FIG. 17, the power generation company G further operates a plurality of stabilization devices 61, 62, 63, etc. In one or more embodiments, the power generation company G does not possess any power sources, and manages only the stabilization devices. The stabilization devices 61, 62, 63, etc. include: a synchronous generator comprising a Power System Stabilizer (PSS); adjustable output distributed power source or power storage facility; Static Synchronous Compensator (STATCOM); serial capacitor; Static Var Compensator (SVC); and intermediate phase modifying equipment. The stabilization devices 61, 62, 63, etc. improve synchronization stability of the power system by output adjustment of active and reactive power.

The measurement instrument 50 is capable of measuring the active power measurement values $P_1$, $P_2$, etc. of the active power exchanged at the connection points between the targeted power grid N1 and the stabilization devices 61, 62, 63, etc., and the frequency measurement values $f_1$, $f_2$, etc. at the connection points. The active power measurement values $P_1$, $P_2$, etc. and the frequency measurement values $f_1$, $f_2$, etc. acquired by the measurement instruments 50 are successively transmitted to the adjusting power measuring apparatus 10 via a predetermined communication network.

The adjusting power measuring apparatus 10 of one or more embodiments executes the processing (Steps S20-S23) shown in FIG. 15 based on the active power measurement values $P_1$, $P_2$, etc. and the frequency measurement values $f_1$, $f_2$, etc. obtained via the measurement instruments 50 shown in FIG. 17, and calculates the adjusting power supplied from the stabilization devices 61, 62, 63, etc. to the targeted power grid N1 and the amount of the compensation for the adjusting power.

By this, the adjusting power measuring apparatus 10 of one or more embodiments and the adjusting power measuring system 1 comprising the apparatus 10 can appropriately calculate also the adjusting power supplied by the stabilization devices 61, 62, 63, etc., depending on the responsiveness.

<Variations of One or More Embodiments>

Although the adjusting power measuring apparatus 10 and adjusting power measuring system 1 of one or more embodiments are described in detail above, the specific structures thereof are not limited thereto, and various design changes and/or modifications can be added thereto without departing from the gist of the present invention.

With the progress of technologies such as Artificial Intelligence (AI) technology, some adjusting power supply sources (power sources 21, 22, etc.) predict the frequency fluctuation in the targeted power grid N1, and perform the output adjustment in advance of future frequency fluctuation. For example, it is assumed that the power source 21 predicts that the frequency lowers at a certain time "t+α" and provides a positive force that gradually increases the active power from time "t" to time "t+α".

The adjusting power calculating unit 1002 of variations of one or more embodiments incorporates also the output adjustment performed by the power source 21 based on the prediction of the future frequency fluctuation into calculation of the adjusting power. Specifically, the adjusting power calculating unit 1002 calculates Formula (16) to obtain the frequency fluctuation amount $df_{1w}(t)$ at a certain time "t."

[Formula 16]

$$df_{1w}(t) = \sum_{t_D=(-10,-9,\ldots,0,1,2,3,4,\ldots,3600)} w(t_D)(f_1(t-t_D) - f_1(t-t_D-1)) \quad (16)$$

Figures 18, 19:
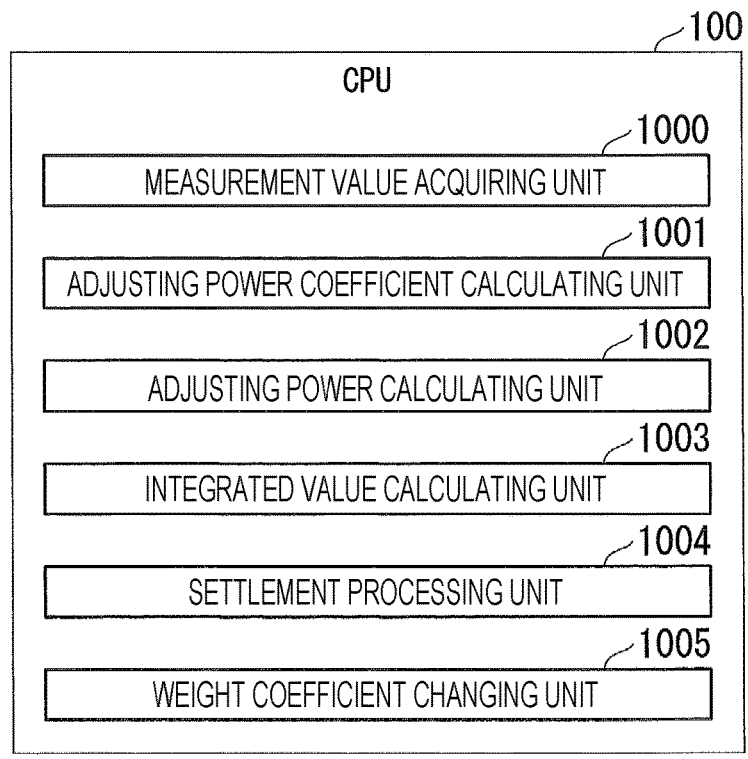
FIG. 18 is a diagram illustrating examples of weight coefficients according to variations of one or more embodiments.
FIG. 19 is a block diagram illustrating a functional composition of the adjusting power measuring apparatus according to one or more embodiments.

FIG. 18 is a diagram illustrating examples of weight coefficients according to variations of one or more embodiments.

In Formula (16), "$df_{1w}(t)$" indicates a sum of values respectively obtained by multiplying a predetermined weight coefficient "w" (FIG. 18) with each fluctuation amount between two frequency measurement values $f_1$ acquired serially in time, among a plurality of frequency measurement values $f_1$ (t) respectively acquired at each second in the past within a predetermined time period (e.g., 1 hour ago) from a certain time "t," and among a plurality of frequency measurement values $f_1$ (t) respectively acquired at each second in the future within a predetermined time period (e.g., 10 seconds after) from the certain time "t."

In the weight coefficient table D2 shown in FIG. 18, weight coefficient "w" is previously set correspondingly to each second during a time period from a future time which is a predetermine time after (e.g., 10 seconds after) from a certain time "t" as a reference (0) to a past time which is a predetermined time before (e.g., 1 hour before) from the certain time "t". As with the aforementioned embodiments, the weight coefficients "w" can be set so that the weight to the response (the fluctuation amount of the frequency measurement value $f_1$) of the power source 21 is largest at time "t" (delay time tD=0) and the weight to the response of the power source 21 becomes smaller as the time goes back to the past from the time "t," namely, as the delay time tD becomes larger than zero (0). The weight coefficients w are also set so that the weight to the response of the power source 21 becomes smaller as the time goes by after the time "t," namely, as the delay time tD becomes smaller than zero (0).

As the subsequent processing by the adjusting power calculating unit 1002 is same as that of the aforementioned embodiments, the detailed descriptions thereof are omitted.

As described above, the adjusting power calculating unit 1002 of variations of one or more embodiments calculates the adjusting power using weight coefficient "w" corresponding to each second during the time period from the future time to the past time with the certain time "t" as reference. This enables incorporating the output adjustment performed based on the prediction of the future frequency fluctuation at the certain time "t" into the calculation, as the adjusting power supplied by the power source 21 at time "t."

According to the adjusting power measuring apparatus 10 of variations of one or more embodiments and the adjusting power measuring system 1 comprising the apparatus 10, when the adjusting power supply source (power sources 21, 22, etc.) predicts the frequency fluctuation and performs the output adjustment, the adjusting power can be measured while incorporating such output adjustment.

The adjusting power measuring apparatus 10 of one or more embodiments and the adjusting power measuring system 1 comprising the apparatus 10 will be described with reference to FIG. 19.

(Function of Adjusting Power Measuring Apparatus)

FIG. 19 is a block diagram illustrating a functional composition of the adjusting power measuring apparatus according to one or more embodiments.

As illustrated in FIG. 19, the CPU 100 of the adjusting power measuring apparatus 10 of one or more embodiments operates according to programs to function as a measurement value acquiring unit 1000, adjusting power coefficient calculating unit 1001, adjusting power calculating unit 1002, integrated value calculating unit 1003, settlement processing unit 1004, and weight coefficient changing unit 1005. As the measurement value acquiring unit 1000, integrated value calculating unit 1003, settlement processing unit 1004, and weight coefficient changing unit 1005 have the same functions as those of the aforementioned embodiments, the detailed descriptions thereof are omitted.

The adjusting power coefficient calculating unit 1001 of one or more embodiments calculates the first adjusting power coefficient $k_{p1}$ based on the active power measurement value $P_1$ (t), frequency measurement value $f_1$ (t), and weight coefficient "w" (FIG. 16 or FIG. 18) in the processing of Step S01 in FIG. 5. Specifically, the adjusting power coefficient calculating unit 1001 of one or more embodiments calculates Formula (17), instead of Formula (2), to obtain the first adjusting power coefficient $k_{p1}$.

[Formula 17]

$$k_{p1} = \frac{\int dP_1(t) df_{w1}(t) dt}{\int df_{w1}(t)^2 dt} \quad (17)$$

As the subsequent processing by the adjusting power measuring apparatus 10 is same as the processing (Steps S02-S04 in FIG. 5) of the aforementioned embodiments, the detailed descriptions thereof are omitted.

As described above, the adjusting power coefficient calculating unit 1001 of one or more embodiments calculates the first adjusting power coefficient based on the fluctuation amount of the active power measurement value, and the sum of values respectively obtained by multiplying the predetermined weight coefficient with each fluctuation amount between two frequency measurement values acquired, among the frequency measurement values, serially in time within the predetermined time period. As a result, when the response delay to the frequency fluctuation by the adjusting power supply source (the power sources 21, 22, etc.) is small, the output of the adjusting power supply source is incorporated into calculation of the adjusting power more than when the response delay is large.

According to the adjusting power measuring apparatus 10 of one or more embodiments and the adjusting power measuring system 1 comprising the apparatus 10, the adjusting power actually supplied by the adjusting power supply source (power sources 21, 22, etc.) can be properly measured depending on the responsiveness of the adjusting power supply source.

In one or more embodiments, various processes executed by the adjusting power measuring apparatus 10 or the measurement instrument 50 are stored in form of programs in a computer-readable recording medium, and the various processes are executed by reading out and executing the programs. The computer-readable recording medium contains a magnetic disk, magneto optical disk, CD-ROM, DVD-ROM, and semiconductor memory. The computer programs can be distributed to a computer via a communication line, and executed by the computer that received the distributed programs.

The programs may be for realizing a part of the aforementioned functions. Moreover, the programs may be for realizing the aforementioned functions in combination with programs already recorded in a computer system, namely, may be a difference file (difference program).

In one or more embodiments, another computer connected to the adjusting power measuring apparatus 10 of one or more embodiments (and variations thereof) or the measurement instrument 50 of one or more embodiments can be provided with a part of the functions of the adjusting power measuring apparatus 10 or the functions of the measurement instrument 50.

Although the power sources 21, 22, etc. perform power generation using the turbine device 211 and the generator in the aforementioned embodiments, the present invention is not limited to these embodiments. In one or more embodiments, the power sources 21, 22, etc. perform solar photoelectric generation using a solar cell.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:
1. An adjusting power measuring apparatus comprising:
 a processor that:
  acquires an active power measurement value of active power exchanged at a connection point between a targeted power grid and an adjusting power supply source that supplies adjusting power to the targeted power grid, acquires a frequency measurement value of frequency at the connection point, calculates, based on the active power measurement value and the frequency measurement value, a first adjusting power coefficient indicating a degree of influence that fluctuation in the active power has on fluctuation in the frequency, calculates, based on the first adjusting power coefficient and a fluctuation measurement value of the fluctuation in the frequency, the adjusting power supplied from the adjusting power supply source to the targeted power grid, and determines, based on the calculated adjusting power, compensation to be paid to an owner of the adjusting power supply source.

2. The adjusting power measuring apparatus according to claim 1, wherein the processor calculates the first adjusting power coefficient based on a fluctuation amount of the active power measurement value and a sum of values respectively obtained by multiplying a predetermined weight coefficient with each fluctuation amount between two frequency measurement values acquired serially in time within a predetermined time period.

3. The adjusting power measuring apparatus according to claim 1, wherein the processor further calculates an adjusting power integrated value by integrating successively-calculated adjusting powers over a predetermined unit time.

4. The adjusting power measuring apparatus according to claim 3, wherein the processor calculates the compensation by multiplying the adjusting power integrated value by a predefined contract unit price.

5. The adjusting power measuring apparatus according to claim 1, wherein the processor calculates, as the fluctuation in the active power, a deviation between an average of the active power measurement value acquired within a predetermined time period and the newly-acquired active power measurement value; and the processor calculates, as the fluctuation in the frequency, a deviation between an average of the frequency measurement value acquired within a predetermined time period and the newly-acquired frequency measurement value.

6. The adjusting power measuring apparatus according to claim 1, wherein the processor further calculates, based on the active power measurement value and the frequency measurement value, a second adjusting power coefficient indicating a degree of influence that the fluctuation in the active power has on an integrated value of the fluctuation in the frequency.

7. An adjusting power measuring apparatus comprising: a processor that:

acquires an active power measurement value of active power exchanged at a connection point between a targeted power grid and an adjusting power supply source that supplies adjusting power to the targeted power grid, acquires a frequency measurement value of frequency at the connection point, calculates the adjusting power supplied from the adjusting power supply source to the targeted power grid based on a fluctuation amount of the active power measurement value and a sum of values respectively obtained by multiplying a predetermined weight coefficient with each fluctuation amount between two frequency measurement values acquired serially in time within a predetermined time period, and determines, based on the calculated adjusting power, compensation to be paid to an owner of the adjusting power supply source.

8. The adjusting power measuring apparatus according to claim 7, wherein the processor further calculates an adjusting power integrated value by integrating successively-calculated adjusting powers over a predetermined unit time.

9. The adjusting power measuring apparatus according to claim 8, wherein the processor calculates the compensation by multiplying the adjusting power integrated value by a predefined contract unit price.

10. An adjusting power measuring system comprising:

the adjusting power measuring apparatus according to claim 1; and a measurement instrument installed at the connection point between the targeted power grid and the adjusting power supply source and capable of measuring the active power exchanged at the connection point and the frequency at the connection point, and wherein the processor of the adjusting power measuring apparatus acquires the active power measurement value and the frequency measurement value via the measurement instrument.

11. The adjusting power measuring system according to claim 10, wherein the measurement instrument is installed at the connection point between the targeted power grid and the adjusting power supply source comprising at least one of a power source, a load, a stabilization device, and an untargeted power grid.

12. A measurement instrument installed at a connection point between a targeted power grid and an adjusting power supply source that supplies adjusting power to the targeted power grid, the measurement instrument comprising:

a sensor that measures active power exchanged at the connection point and frequency at the connection point, a processor that:

acquires an active power measurement value and a frequency measurement value via the sensor;

calculates, based on the active power measurement value and the frequency measurement value, a first adjusting power coefficient indicating a degree of influence that fluctuation in the active power has on fluctuation in the frequency, calculates, based on the first adjusting power coefficient and a fluctuation measurement value of the fluctuation in the frequency, the adjusting power supplied from the adjusting power supply source to the targeted power grid, and determines, based on the calculated adjusting power, compensation to be paid to an owner of the adjusting power supply source.

\* \* \* \* \*